United States Patent
Yuki et al.

(10) Patent No.: US 12,199,191 B2
(45) Date of Patent: Jan. 14, 2025

(54) SEMICONDUCTOR DEVICE

(71) Applicant: ROHM CO., LTD., Kyoto (JP)

(72) Inventors: Tadao Yuki, Kyoto (JP); Takeshi Ishida, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 302 days.

(21) Appl. No.: 17/762,022

(22) PCT Filed: Nov. 25, 2020

(86) PCT No.: PCT/JP2020/043842
§ 371 (c)(1),
(2) Date: Mar. 18, 2022

(87) PCT Pub. No.: WO2021/106939
PCT Pub. Date: Jun. 3, 2021

(65) Prior Publication Data
US 2022/0336682 A1    Oct. 20, 2022

(30) Foreign Application Priority Data
Nov. 29, 2019  (JP) ................................ 2019-217069

(51) Int. Cl.
*H01L 29/861* (2006.01)
*H01L 29/06* (2006.01)
(Continued)

(52) U.S. Cl.
CPC ........ *H01L 29/861* (2013.01); *H01L 29/0692* (2013.01); *H01L 29/0878* (2013.01);
(Continued)

(58) Field of Classification Search
None
See application file for complete search history.

(56) References Cited

U.S. PATENT DOCUMENTS 5,982,015 A   11/1999  Hirayama et al.
6,914,298 B1   7/2005  Hamazawa
(Continued)

FOREIGN PATENT DOCUMENTS

JP   H08340101 A   12/1996
JP   H11-233795 A   8/1999
(Continued)

OTHER PUBLICATIONS

Japanese Office Action dated Nov. 28, 2024, in the counter Japanese patent application No. 2021-561456.

*Primary Examiner* — Bo B Jang
(74) *Attorney, Agent, or Firm* — Rabin & Berdo, P.C.

(57) ABSTRACT

A semiconductor device includes a semiconductor layer of a first conductivity type that has a main surface and that includes a device region, a base region of a second conductivity type that is formed in a surface layer portion of the main surface at the device region, a source region of the first conductivity type that is formed in a surface layer portion of the base region at an interval inward from a peripheral portion of the base region and that defines a channel region with the semiconductor layer, a base contact region of the second conductivity type that is formed in a region different from the source region at the surface layer portion of the base region and that has an impurity concentration exceeding an impurity concentration of the base region, a well region of the first conductivity type that is formed in the surface layer portion of the main surface at an interval from the base region at the device region and that defines a drift region with the base region, a drain region of the first conductivity type that is formed in a surface layer portion of the well region, an impurity region of the second conductivity type that is formed in the surface layer portion of the well region and that is electrically connected to the drain region, and a gate structure that has a gate insulating film
(Continued)

covering the channel region on the main surface and a gate electrode facing the channel region on the gate insulating film and electrically connected to the source region and the base contact region.

18 Claims, 9 Drawing Sheets

(51) Int. Cl.
    *H01L 29/08*     (2006.01)
    *H01L 29/10*     (2006.01)
    *H01L 29/36*     (2006.01)
    *H01L 29/423*     (2006.01)
    *H01L 29/66*     (2006.01)

(52) U.S. Cl.
    CPC .......... *H01L 29/1095* (2013.01); *H01L 29/36* (2013.01); *H01L 29/42364* (2013.01); *H01L 29/66477* (2013.01)

(56) References Cited

U.S. PATENT DOCUMENTS

| | | | | |
|---|---|---|---|---|
| 7,737,523 | B2* | 6/2010 | Kikuchi | ................ H01L 29/872 |
| | | | | 257/E27.04 |
| 2012/0139079 | A1* | 6/2012 | Tokura | ................ H01L 29/0619 |
| | | | | 257/471 |
| 2015/0162400 | A1 | 6/2015 | Yano | |

FOREIGN PATENT DOCUMENTS

| | | | |
|---|---|---|---|
| JP | 2003-218348 | A | 7/2003 |
| JP | 2006-270034 | A | 10/2006 |
| JP | 2007-027228 | A | 2/2007 |
| JP | 2012004460 | A | 1/2012 |
| JP | 2015-115365 | A | 6/2015 |

* cited by examiner

SEMICONDUCTOR DEVICE

TECHNICAL FIELD

The present invention relates to a semiconductor device that has an EIS (Electrode-Insulator-Semiconductor)-type diode structure that has a laminated structure including an electrode, an insulator and a semiconductor.

BACKGROUND ART

Patent Literature 1 discloses a semiconductor device that has the EIS-type diode structure. This semiconductor device includes a semiconductor substrate of an n-type, a base region of a p-type, a source region of the n-type, an anode region of the p-type, a cathode region of the n-type, a gate insulating film and a gate electrode.

The base region is formed in a surface layer portion of the semiconductor substrate. The source region is formed in a surface layer portion of the base region at an interval inward from a peripheral portion of the base region and defines a channel region with the semiconductor substrate. The anode region is formed in a region different from the source region in the surface layer portion of the base region. The cathode region is formed in the surface layer portion of the semiconductor substrate at an interval from the base region and defines a drift region with the base region. The gate insulating film covers the channel region on the semiconductor substrate. The gate electrode is formed on the gate insulating film and faces the channel region with the gate insulating film interposed therebetween. The gate electrode is electrically connected to the source region and the anode region.

CITATION LIST

Patent Literature

Patent Literature 1: Japanese Patent Publication No. 2007-27228

SUMMARY OF INVENTION

Technical Problem

The EIS-type diode structure has a structural feature that an electrostatic withstand capacity is low. The electrostatic withstand capacity is also referred to as an ESD (Electro Static Discharge) withstand voltage.

One embodiment of the present invention provides a semiconductor device that has an EIS-type diode structure and is capable of improving an electrostatic withstand capacity.

Solution to Problem

One embodiment of the present invention provides a semiconductor device including a semiconductor layer of a first conductivity type that has a main surface and that includes a device region, a base region of a second conductivity type that is formed in a surface layer portion of the main surface at the device region, a source region of the first conductivity type that is formed in a surface layer portion of the base region at an interval inward from a peripheral portion of the base region and that defines a channel region with the semiconductor layer, a base contact region of the second conductivity type that is formed in a region different from the source region at the surface layer portion of the base region and that has an impurity concentration exceeding an impurity concentration of the base region, a well region of the first conductivity type that is formed in the surface layer portion of the main surface at an interval from the base region at the device region and that defines a drift region with the base region, a drain region of the first conductivity type that is formed in a surface layer portion of the well region, an impurity region of the second conductivity type that is formed in the surface layer portion of the well region and that is electrically connected to the drain region, and a gate structure that has a gate insulating film covering the channel region on the main surface and a gate electrode facing the channel region on the gate insulating film and electrically connected to the source region and the base contact region.

This semiconductor device includes an EIS-type diode structure at the device region. Specifically, the diode structure includes the base region, the source region, the base contact region, the well region, the drain region and the gate structure. Also, the semiconductor device includes a thyristor structure that is electrically connected to the diode structure at the device region. Specifically, the thyristor structure includes the impurity region (the second conductivity type), the semiconductor layer (the first conductivity type), the base region (the second conductivity type) and the source region (the first conductivity type) that are formed in that order along the main surface of the semiconductor layer.

More specifically, the thyristor structure includes a first transistor structure of a first polar type at the well region side and a second transistor structure of a second polar type at the base region side. The first transistor structure includes the impurity region (the second conductivity type), the semiconductor layer (the first conductivity type) and the base region (the second conductivity type) that are formed in that order along the main surface of the semiconductor layer. The second transistor structure includes the source region (the first conductivity type), the base region (the second conductivity type) and the semiconductor layer (the first conductivity type) that are formed in that order along the main surface of the semiconductor layer.

When a forward voltage is applied to the diode structure, the diode structure becomes ON state whereas the thyristor structure becomes OFF state. The thyristor structure becomes OFF state since the drain region and the impurity region are to be fixed to a same potential. The diode structure is therefore conducted and a forward current flows into the diode structure. Further, this forward voltage also flows into the first transistor structure that is electrically connected to the diode structure. Therefore, when a forward overvoltage due to a static electricity, etc. is applied to the diode structure, a forward overcurrent can be processed by the diode structure and the first transistor structure.

On the other hand, when a reverse voltage is applied to the diode structure, the diode structure becomes OFF state whereas the thyristor structure becomes ON state. The thyristor structure is therefore conducted and a reverse current flows into the thyristor structure. Therefore, when a reverse overvoltage due to the static electricity, etc. is applied to the diode structure, the reverse overcurrent can be processed by the thyristor structure. As a result, according to this semiconductor device, it is possible to improve an electrostatic withstand capacity.

The aforementioned or yet other objects, features, and effects of the present invention shall be clarified by the following description of embodiments with reference to the accompanying drawings.

DESCRIPTION OF EMBODIMENTS

Figure 1:
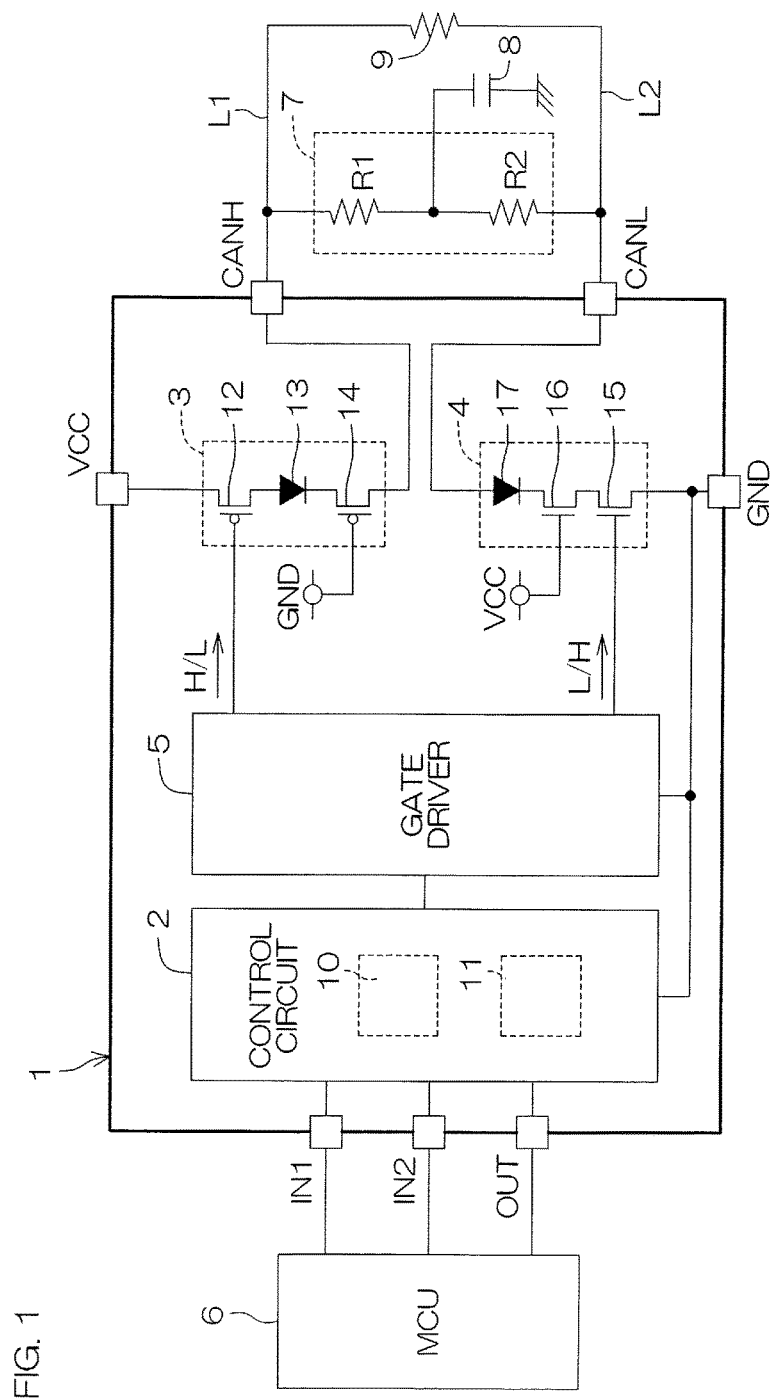
FIG. 1 is a circuit diagram showing an electrical configuration of a main part of a semiconductor device according to one embodiment of the present invention.

FIG. 1 is a circuit diagram showing an electrical configuration of a main part of a semiconductor device according to one embodiment of the present invention. The semiconductor device 1 is a transceiver integrated circuit device to be used for CAN (Controller Area Network) which is one type of an in-vehicle network. The semiconductor device 1 includes an input terminal IN, an output terminal OUT, a power supply terminal VCC, a ground terminal GND, a high side terminal CANH, a low side terminal CANL, a control circuit 2, a high side output circuit 3, a low side output circuit 4 and a gate driver circuit 5.

A number of the input terminal IN is arbitrary. In FIG. 1, an example in which the input terminal IN includes a first input terminal IN1 and a second input terminal IN2 is shown. In FIG. 1, an example in which a microcomputer 6 is connected to the input terminal IN and the output terminal OUT, and a resistance division circuit 7, a capacitor 8 and a termination resistance 9 are connected between the high side terminal CANH and the low side terminal CANL is shown.

The control circuit 2 is electrically connected to the plurality of input terminal IN, the output terminal OUT and the ground terminal GND. The control circuit 2 includes an electrical signal generation circuit 10 and a functional circuit 11. The electrical signal generation circuit 10 generates predetermined electronic signals by which various circuits are to be derived based on an input signal from the input terminal IN, and outputs the electronic signals to the various circuits. The functional circuit 11 generates electronic signals by which the various circuits are to be monitored based on an input signal from the input terminal IN and electronic signals from the various circuits, and outputs the electronic signals to the output terminal OUT.

For example, the functional circuit 11 includes a single or a plurality of protection circuits that protect the various circuits. The functional circuit 11 may include at least one among an overcurrent protection circuit, an overheat protection circuit and an under voltage malfunction suppression circuit as examples of the protection circuit. The overcurrent protection circuit protects the various circuits from an overcurrent. The overheat protection circuit protects the various circuits from overheat. The under voltage malfunction suppression circuit suppresses the malfunction of the various circuits in a low voltage state.

The high side output circuit 3 is electrically connected to the power supply terminal VCC, the high side terminal CANH and the gate driver circuit 5. The high side output circuit 3 has a series circuit that includes a first drive transistor 12, a first backflow prevention diode 13 and a first protection transistor 14. The first drive transistor 12 and the first protection transistor 14 each consists of a MISFET (Metal Insulator Field Effect Transistor) of a p-type (a first polar type or a second polar type).

A gate of the first drive transistor 12 is electrically connected to the gate driver circuit 5. A source of the first drive transistor 12 is connected to the power supply terminal VCC. An anode of the first backflow prevention diode 13 is connected to a drain of the first drive transistor 12. A gate of the first protection transistor 14 is electrically connected to the ground terminal GND. A source of the first protection transistor 14 is connected to a cathode of the first backflow prevention diode 13. A drain of the first protection transistor 14 is connected to the high side terminal CANH. The first protection transistor 14 suppresses an outflow of a current from the high side terminal CANH to an outside (the termination resistance 9 side) when the high side terminal CANH becomes a negative voltage.

The low side output circuit 4 is electrically connected to the ground terminal GND, the low side terminal CANL and the gate driver circuit 5. The low side output circuit 4 has a series circuit that includes a second drive transistor 15, a second protection transistor 16 and a second backflow prevention diode 17. The second drive transistor 15 and the second protection transistor 16 each consists of a MISFET of an n-type which consists of an opposite polar type to the p-type.

A gate of the second drive transistor 15 is electrically connected to the gate driver circuit 5. A source of the second drive transistor 15 is connected to the ground terminal GND. A gate of the second protection transistor 16 is connected to the power supply terminal VCC. A source of the second protection transistor 16 is connected to a drain of the second drive transistor 15. A cathode of the second backflow prevention diode 17 is connected to a drain of the second protection transistor 16. An anode of the second backflow prevention diode 17 is connected to the low side terminal CANL. The second protection transistor 16 suppresses an inflow of a current from the outside (the termination resistance 9 side) to the low side terminal CANL when the low side terminal CANL becomes a positive voltage.

The gate driver circuit 5 is electrically connected to the control circuit 2, the high side output circuit 3, the low side output circuit 4 and the ground terminal GND. The gate driver circuit 5 generates a first control signal H/L having a predetermined pulse waveform and a second control signal L/H having a predetermined pulse waveform in response to the electronic signals from the control circuit 2. The second control signal L/H consists of an inverted signal of the first control signal H/L. The first control signal H/L is to be input to the gate of first drive transistor 12, and the second control signal L/H is to be input to the gate of the second drive transistor 15.

The resistance division circuit 7 includes a first resistance R1 and a second resistance R2. One end of the first resistance R1 is connected to the high side terminal CANH. One end of the second resistance R2 is connected to the other end of the first resistance R1. The other end of the second resistance R2 is connected to the low side terminal CANL. One end of the capacitor 8 is connected to a connecting portion between the first resistance R1 and the second resistance R2. The other end of the capacitor 8 is grounded. One end of the termination resistance 9 is connected to the high side terminal CANH via the first base line L1. The other end of the termination resistance 9 is connected to the low side terminal CANL via the second base line L2.

In a case in which the first control signal H/L of the low level is input to the first drive transistor 12 and the second control signal L/H of the high level is input to the second drive transistor 15, both of the first drive transistor 12 and the second drive transistor 15 become ON states. Therefore, a bus signal SH of 3.5V (standard value) is output to the high side terminal CANH and a bus signal SL of 1.5V (standard value) is output to the low side terminal CANL (that is, dominant state).

On the other hand, in a case in which the first control signal H/L of the high level is input to the first drive transistor 12 and the second control signal L/H of the low level is input to the second drive transistor 15, both of the first drive transistor 12 and the second drive transistor 15 become OFF state. Therefore, a bus signal SH of 2.5V (standard value) is output to the high side terminal CANH and a bus signal SL of 2.5V (standard value) is output to the low side terminal CANL (that is, recessive state). Hereinafter, structures of the semiconductor device 1 shall be described.

Figure 2:
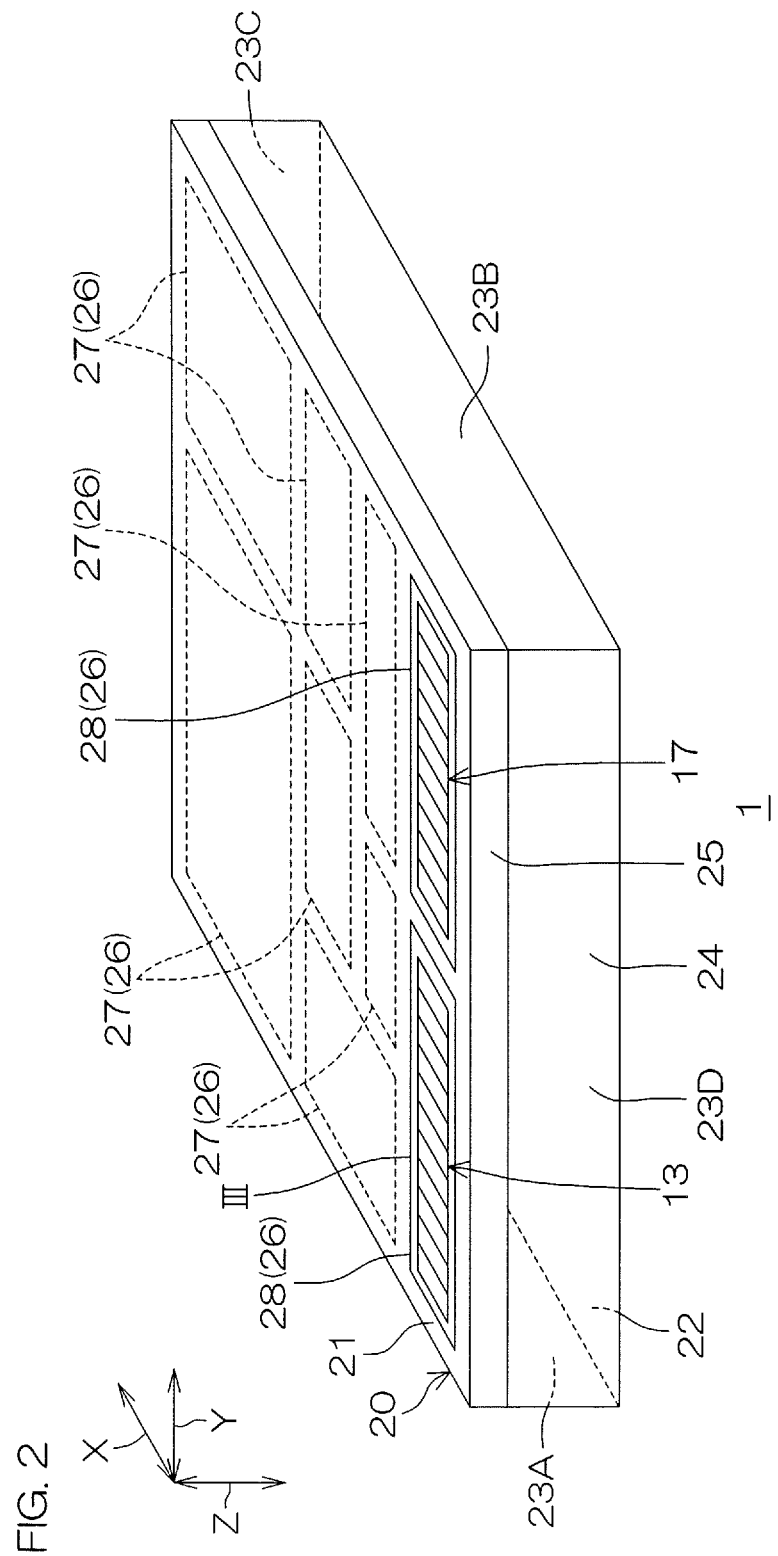
FIG. 2 is a perspective view showing the semiconductor device shown in FIG. 1.

FIG. 2 is a perspective view showing the semiconductor device 1 shown in FIG. 1. In FIG. 2, illustrations of the input terminal IN, the power supply terminal VCC, the ground terminal GND, the high side terminal CANH and the low side terminal CANL described above are omitted.

With reference to FIG. 2, the semiconductor device 1 includes a semiconductor chip 20 that is made of a silicon, in this embodiment. The semiconductor chip 20 is formed in a rectangular parallelepiped shape. The semiconductor chip 20 has a first main surface 21 at one side, a second main surface 22 at the other side, and first to fourth side surfaces 23A to 23D each connecting the first main surface 21 and the second main surface 22.

The first main surface 21 and the second main surface 22 are each formed in a quadrilateral shape in plan view as viewed from a normal direction Z thereof (hereinafter, referred to as simply "in plan view"). The first side surface 23A and the second side surface 23B each extend in a first direction X and oppose in a second direction Y orthogonal to the first direction X. The third side surface 23C and the fourth side surface 23D each extend in the second direction Y and oppose in the first direction X.

The semiconductor chip 20 has a laminated structure that includes a semiconductor substrate 24 of a p-type (first conductivity type) and a semiconductor layer 25 of an n-type (second conductivity type) consisting of an opposite conductive type to the p-type that are laminated in that order from the second main surface 22 side to the first main surface 21 side, in this embodiment. The semiconductor substrate 24 forms the second main surface 22 and parts of the first to fourth side surfaces 23A to 23D. The semiconductor layer 25 forms the first main surface 21 and parts of the first to fourth side surfaces 23A to 23D.

A p-type impurity concentration of the semiconductor substrate 24 may be not less than $1\times10^{13}$ cm$^{-3}$ and not more than $1\times10^{16}$ cm$^{-3}$. A thickness of the semiconductor substrate 24 may be not less than 100 μm and not more than 1000 μm. The thickness of the semiconductor substrate 24 is preferably not less than 200 μm and not more than 700 μm.

The semiconductor layer 25 consists of an epitaxial layer formed on the semiconductor substrate 24, in this embodiment. An n-type impurity concentration of the semiconductor layer 25 may be not less than $1\times10^{14}$ cm$^{-3}$ and not more than $1\times10^{16}$ cm$^{-3}$. A thickness of the semiconductor layer 25 is less than the thickness of the semiconductor substrate 24. The thickness of the semiconductor layer 25 may be not less than 1 μm and not more than 50 μm. The thickness of the semiconductor layer 25 is preferably not less than 5 μm and not more than 20 μm.

The semiconductor chip 20 includes a plurality of device regions 26 each demarcated in the first main surface 21. The plurality of device regions 26 includes a single or a plurality of (a plurality of, in this embodiment) functional device regions 27 and a single or a plurality of (two, in this embodiment) diode regions 28. Numbers and positions of the functional device regions 27 and the diode regions 28 are arbitrary.

The functional device regions 27 are regions in each of which a various functional device that configures a part of or a whole of the control circuit 2, the gate driver circuit 5, the first drive transistor 12, the first protection transistor 14, the second drive transistor 15, the second protection transistor 16, etc. aforementioned is formed. The functional device may be formed by using the first main surface 21 and/or a surface layer portion of the first main surface 21. The functional device may include at least one among a semiconductor switching device, a semiconductor rectifying device and a passive device. The functional device may include network circuit in which the semiconductor switching device, the semiconductor rectifying device and the passive device are combined.

The semiconductor switching device may include at least one among a MISFET, a CMIS (Complementary-MISFET), a BJT (Bipolar Junction Transistor), an IGBT (Insulated Gate Bipolar Junction Transistor) and a JFET (Junction Field Effect Transistor). The semiconductor switching devices include the first drive transistor 12, the first protection transistor 14, the second drive transistor 15 and the second protection transistor 16 aforementioned.

The semiconductor rectifying device may include at least one among a pn-junction diode, a pin-junction diode, a zener diode, a schottky barrier diode and a fast recovery diode. The passive device may include at least one among a resistor, a capacitor and an inductor.

The plurality of diode regions 28 are each defined at an interval from the plurality of functional device regions 27. The plurality of diode regions 28 are regions in which the first backflow prevention diode 13 and the second backflow prevention diode 17 aforementioned are each formed. Structures in the plurality of diode regions 28 are substantially same. Hereinafter, specific structures of the diode regions 28 shall be described by taking the diode regions 28 (region III shown in FIG. 2) of the first backflow prevention diode 13 side as an example. Descriptions of the diode regions 28 of the first backflow prevention diode 13 side will be applied to descriptions of the diode regions 28 of the second backflow prevention diode 17 side.

Figure 3:
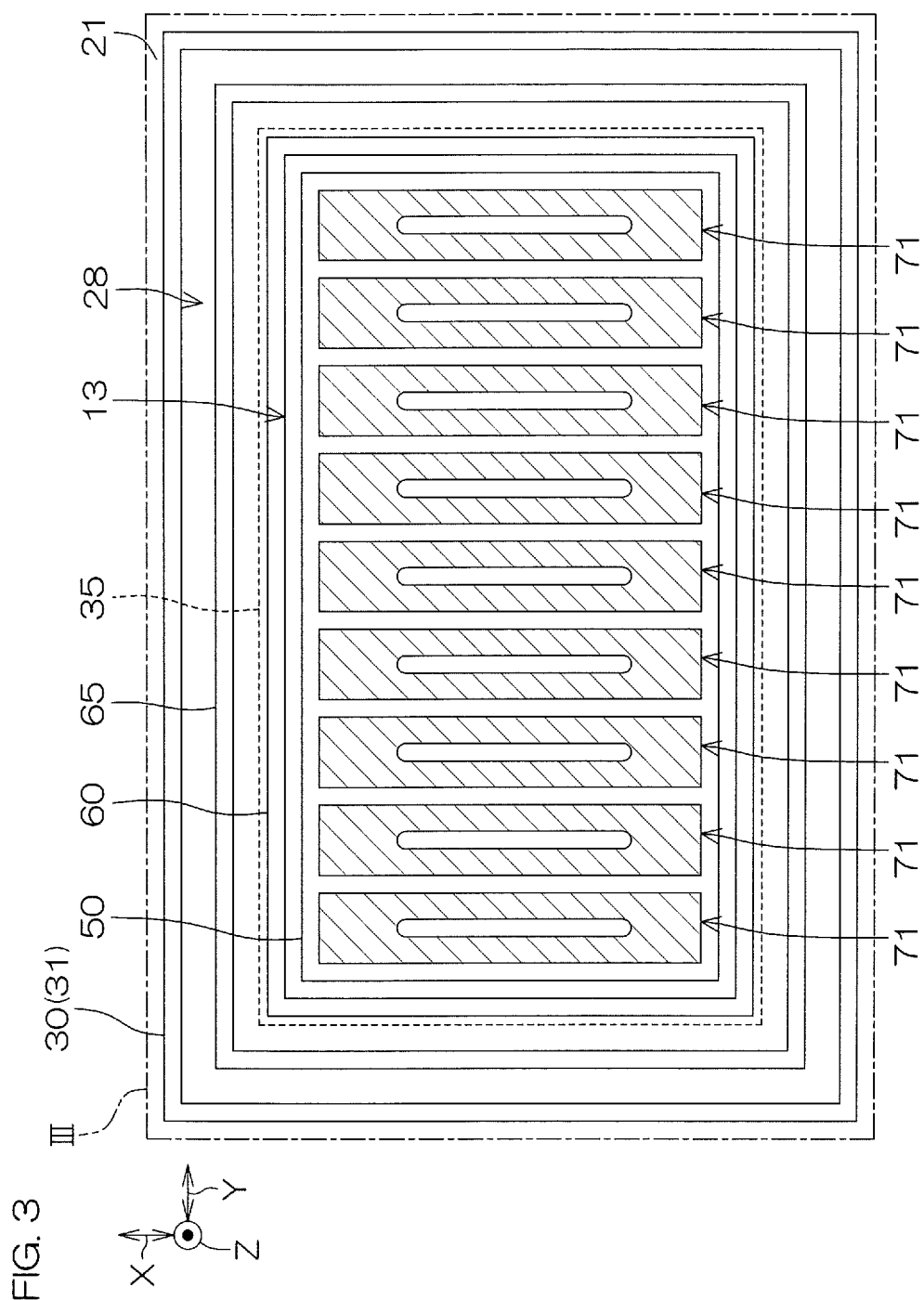
FIG. 3 is an enlarged view of a region III shown in FIG. 2.
Figure 4:
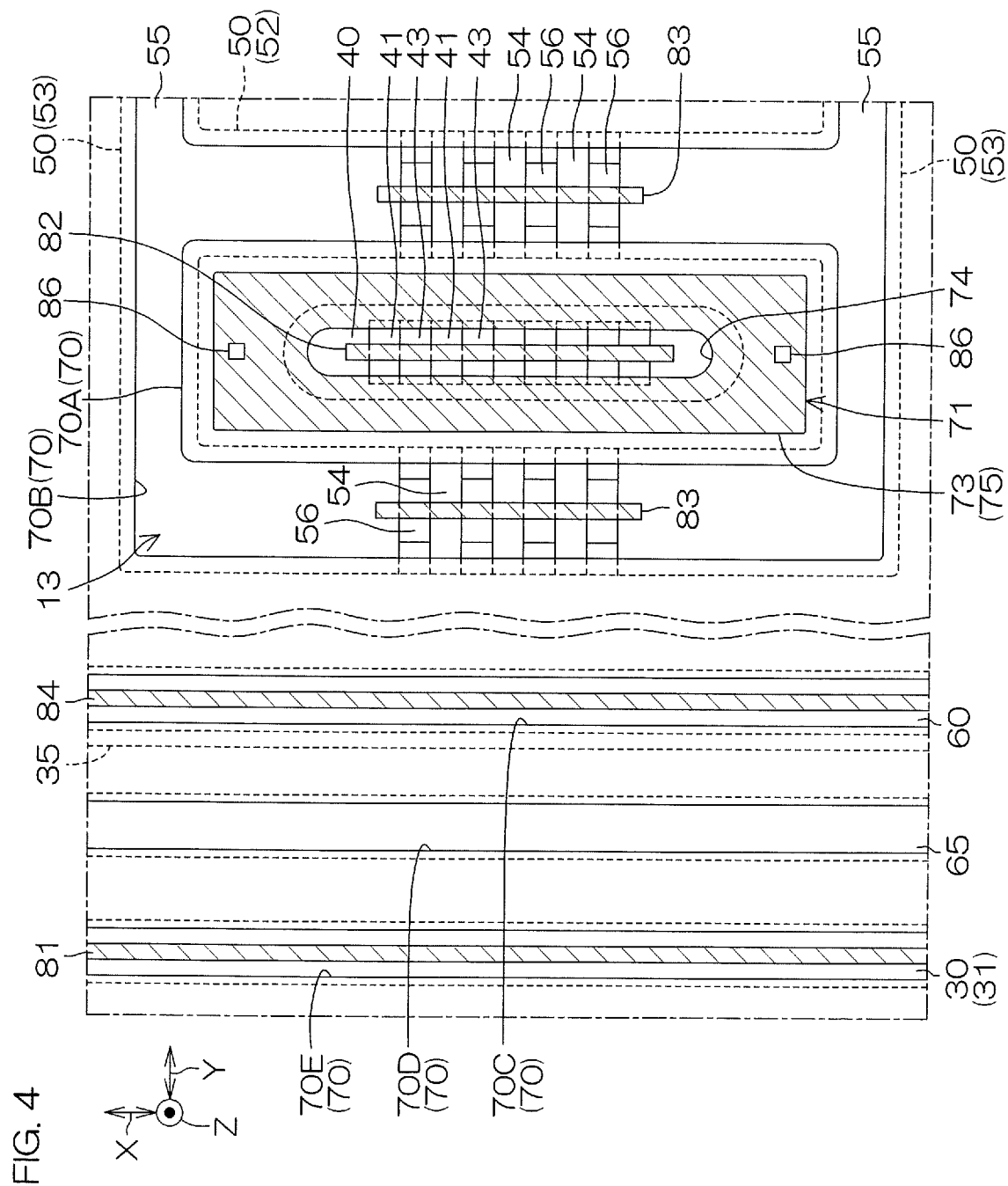
FIG. 4 is an enlarged view of a main part of a structure shown in FIG. 3.
Figure 5:
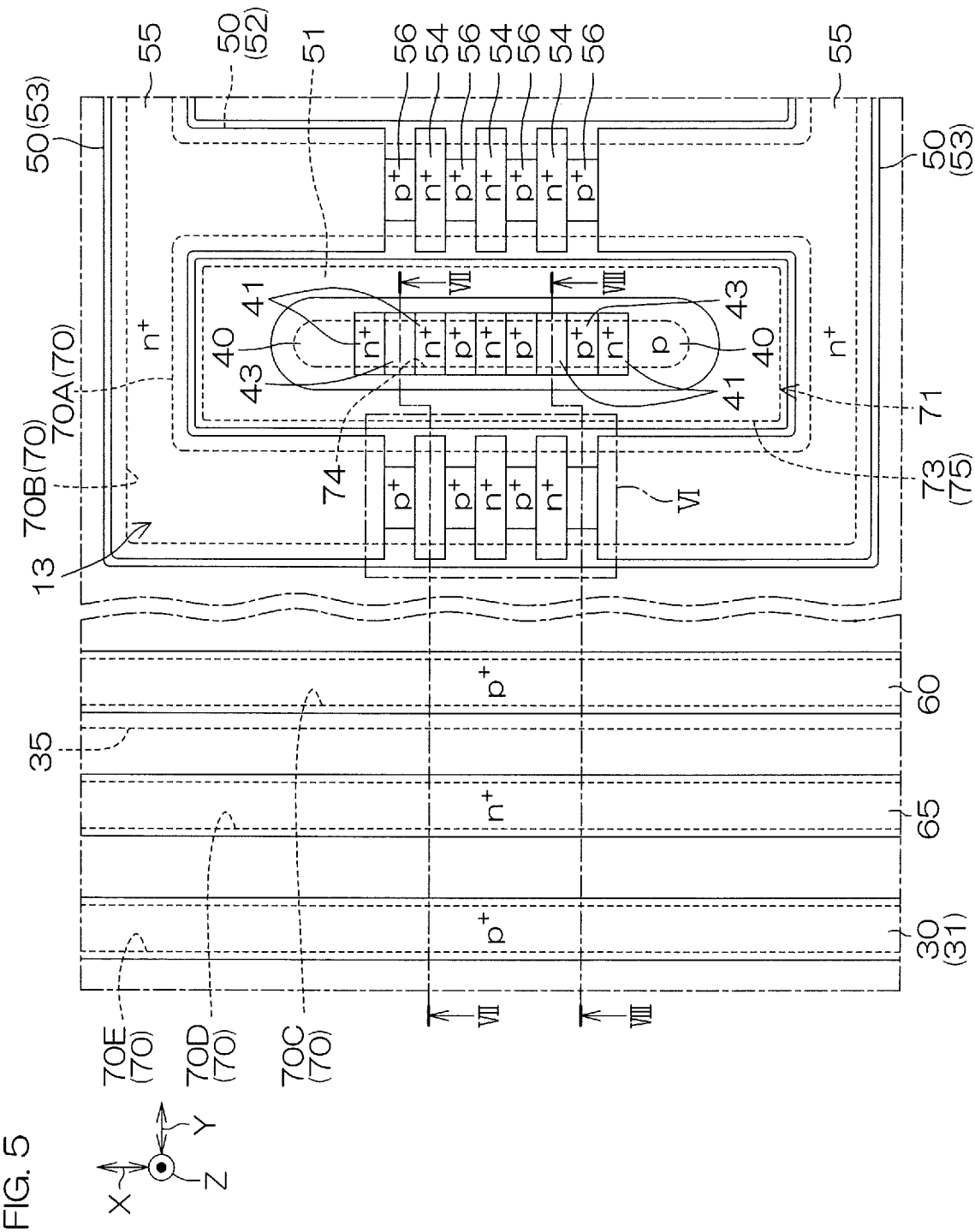
FIG. 5 is a diagram in which structures on a semiconductor layer are removed from the structures shown in FIG. 4.
Figure 6:
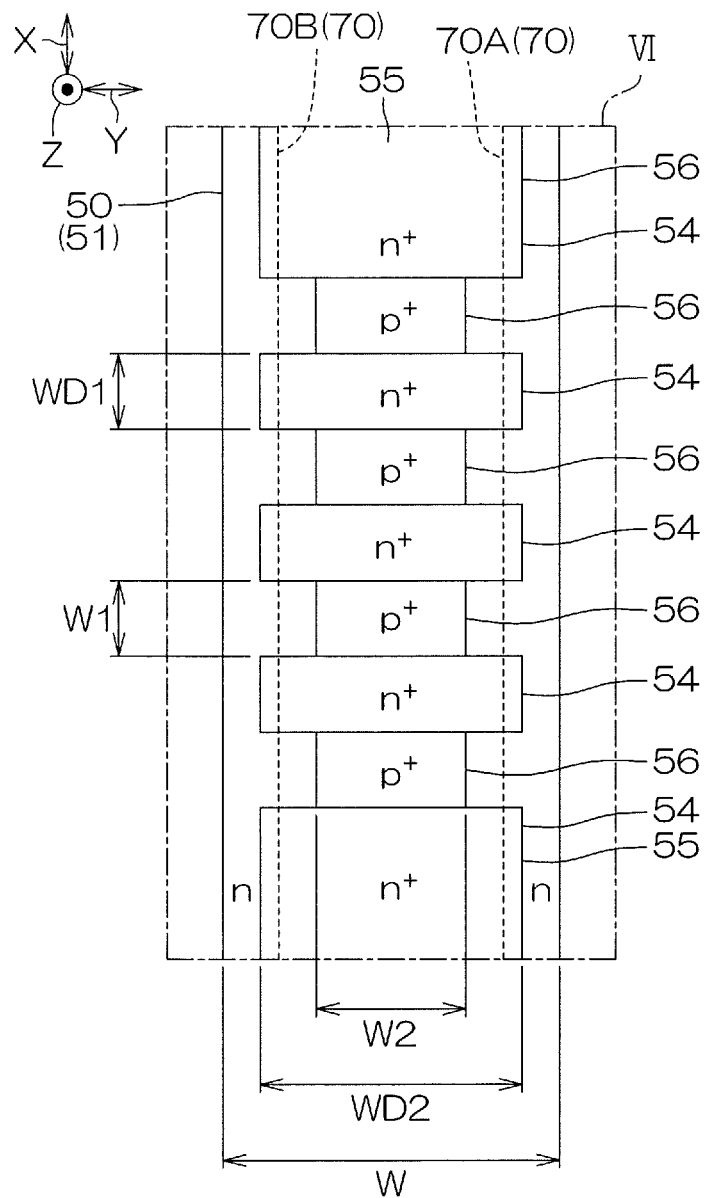
FIG. 6 is an enlarged view of a region VI shown in FIG. 5.
Figure 7:
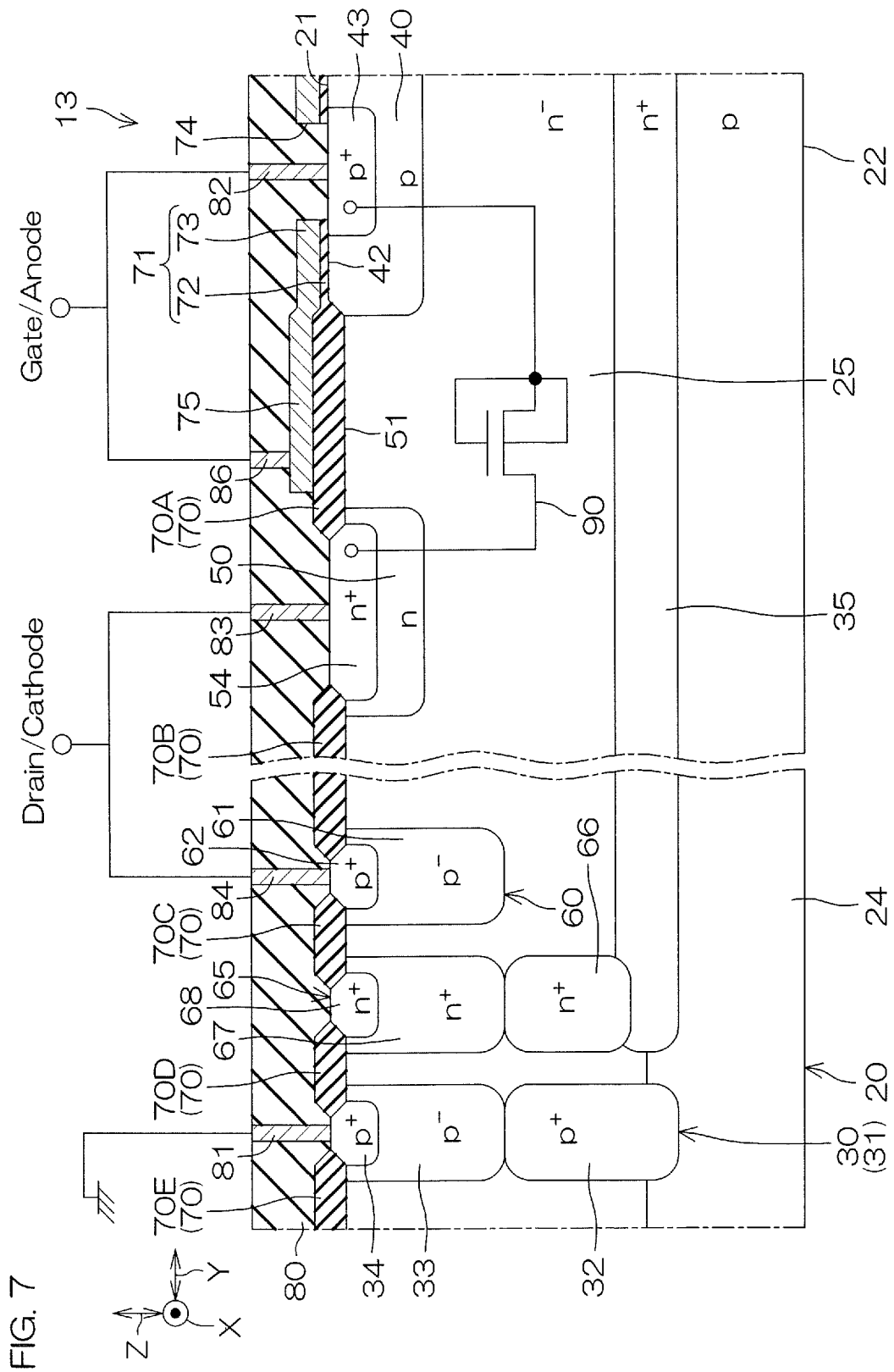
FIG. 7 is a cross sectional view along a line VII-VII shown in FIG. 5.
Figure 8:
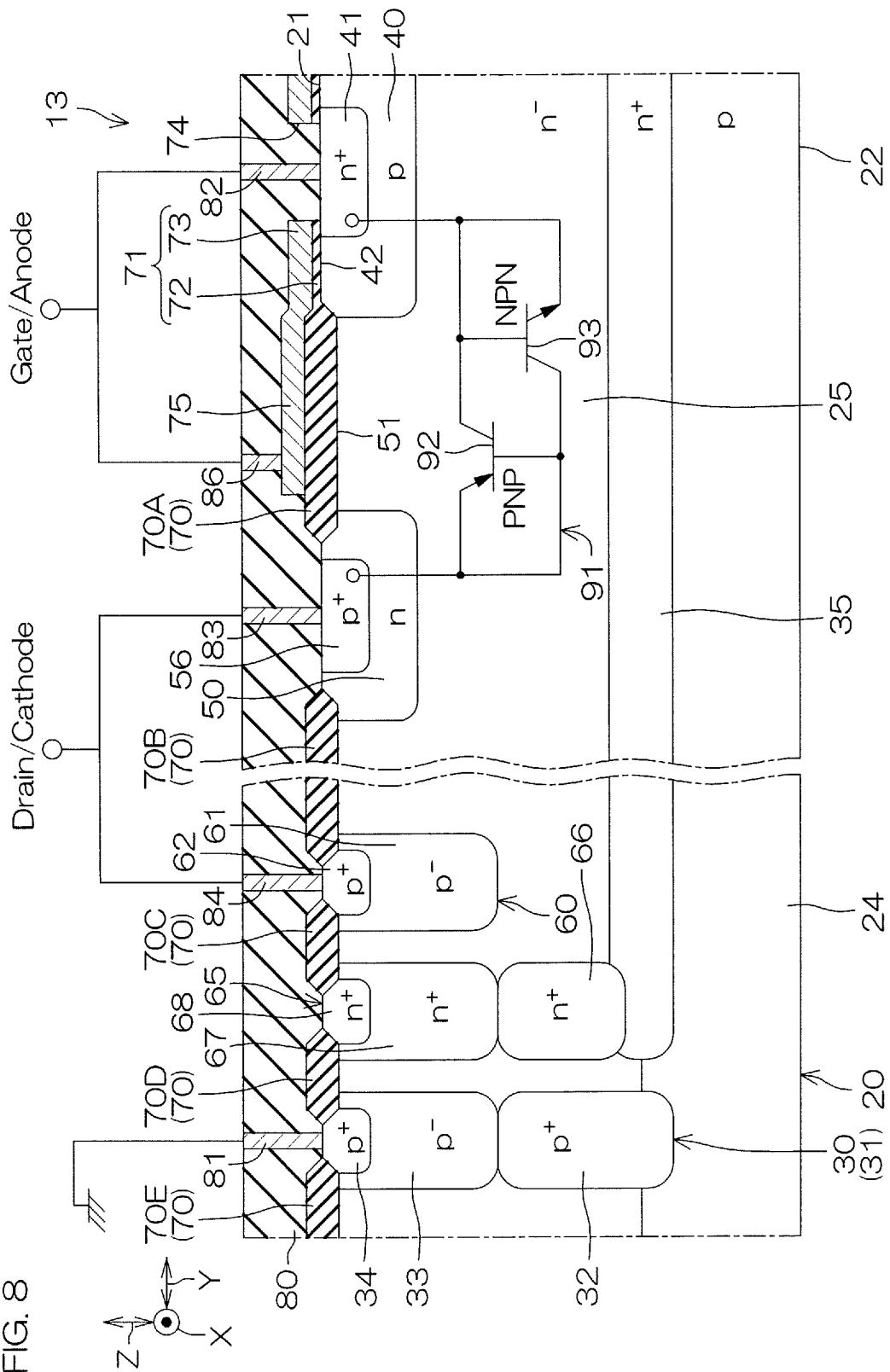
FIG. 8 is a cross sectional view along a line VIII-VIII shown in FIG. 5.

FIG. 3 is an enlarged view of a region III shown in FIG. 2. FIG. 4 is an enlarged view of a main part of a structure shown in FIG. 3. FIG. 5 is a diagram in which structures on the semiconductor layer 25 are removed from the structures shown in FIG. 4. FIG. 6 is an enlarged view of a region VI shown in FIG. 5. FIG. 7 is a cross sectional view along a line VII-VII shown in FIG. 5. FIG. 8 is a cross sectional view along a line VIII-VIII shown in FIG. 5.

With reference to FIG. 3 to FIG. 8, the semiconductor device 1 includes a region separation structure 30 that demarcates a part of region of the semiconductor layer 25 as the diode region 28 at the first main surface 21. The region separation structure 30 electrically separates the diode region 28 from the plurality of functional device regions 27. The region separation structure 30 is formed in an annular shape (quadrilateral annular shape, in this embodiment) surrounding the diode region 28, in plan view. A planar shape of the diode region 28 is arranged by an inner edge of the region separation structure 30. The region separation structure 30 defines the diode region 28 into a quadrilateral shape in plan view, in this embodiment.

The region separation structure 30 is composed of a column region 31 of the p-type that is formed in a wall shape in the semiconductor layer 25 such as to be electrically connected to the semiconductor substrate 24, in this embodiment. The column region 31 includes a column embedded region 32, a column well region 33 and a column contact region 34.

The column embedded region 32 is formed across a boundary between the semiconductor substrate 24 and the semiconductor layer 25 and is electrically connected to the semiconductor substrate 24. The single column embedded region 32 is formed in this embodiment, but a number of the column embedded region 32 is arbitrary as long as the column embedded region 32 is electrically connected to the semiconductor substrate 24. A plurality of column embedded region 32 may be laminated from the boundary to the first main surface 21 side. A p-type impurity concentration of the column embedded region 32 may be not less than $1 \times 10^{16}$ cm$^{-3}$ and not more than $1 \times 10^{20}$ cm$^{-3}$.

The column well region 33 is formed in the surface layer portion of the first main surface 21. Specifically, the column well region 33 is formed in a region between the first main surface 21 and the column embedded region 32 in the semiconductor layer 25 and is electrically connected to the column embedded region 32. The column well region 33 may have a p-type impurity concentration less than the p-type impurity concentration of the column embedded region 32. The p-type impurity concentration of the column well region 33 may be not less than $1 \times 10^{15}$ cm$^{-3}$ and not more than $1 \times 10^{17}$ cm$^{-3}$.

The column contact region 34 is formed in the surface layer portion of the column well region 33 at an interval from a bottom portion of the column well region 33 to the first main surface 21 side. The column contact region 34 has a p-type impurity concentration more than the p-type impurity concentration of the column well region 33. The p-type impurity concentration of the column contact region 34 may be not less than $1 \times 10^{18}$ cm$^{-3}$ and not more than $1 \times 10^{20}$ cm$^{-3}$.

The semiconductor device 1 includes an embedded region 35 of the n-type that is formed across the boundary between the semiconductor substrate 24 and the semiconductor layer 25 at the diode region 28. In FIG. 3 to FIG. 5, the embedded region 35 is shown by a broken line. The embedded region 35 has an n-type impurity concentration more than the n-type impurity concentration of the semiconductor layer 25. The n-type impurity concentration of the embedded region 35 may be not less than $1 \times 10^{16}$ cm$^{-3}$ and not more than $1 \times 10^{20}$ cm$^{-3}$.

The embedded region 35 is formed at an interval from the first main surface 21 to the semiconductor substrate 24 side and opposes the first main surface 21 across a part of the semiconductor layer 25. The embedded region 35 is formed at an interval inward from the region separation structure 30. In this case, a part of the n-type impurities of the embedded region 35 may be diffused into a periphery of the diode region 28. That is, the embedded region 35 may have a concentration gradient in which an n-type impurity concentration at the periphery side of the diode region 28 is lower than an n-type impurity concentration at an inner portion side of the diode region 28.

The semiconductor device 1 includes a single or a plurality of (a plurality of, in this embodiment) base regions 40 of the p-type that are formed in the surface layer portion of the first main surface 21 at the diode region 28. The plurality of base regions 40 are each formed as a part of an anode region of the first backflow prevention diode 13. A p-type impurity concentration of each base region 40 may be not less than $1 \times 10^{15}$ cm$^{-3}$ and not more than $1 \times 10^{17}$ cm$^{-3}$.

Specifically, the plurality of base regions 40 are formed in a region that is surrounded by a peripheral portion of the embedded region 35 in plan view, respectively. The plurality of base regions 40 are formed at intervals from the embedded region 35 to the first main surface 21 side and each opposes the embedded region 35 across a part of the semiconductor layer 25. The plurality of base regions 40 are each formed in a band shape extending in the first direction X and arranged at intervals in the second direction Y, in this embodiment. The plurality of base regions 40 is therefore formed in a stripe shape extending in the first direction X in plan view.

The semiconductor device 1 includes a single or a plurality of (a plurality of, in this embodiment) source regions 41 of the n-type that are formed in the surface layer portion of each base region 40. Each source region 41 has an n-type impurity concentration more than the n-type impurity concentration of the semiconductor layer 25. The n-type impurity concentration of each source region 41 may be not less than $1 \times 10^{18}$ cm$^{-3}$ and not more than $1 \times 10^{20}$ cm$^{-3}$.

The plurality of source regions 41 are arranged at intervals in the first direction X at the surface layer portion of each base region 40. The plurality of source regions 41 are formed at intervals inward from the peripheral portion of each base region 40 and each defines a channel region 42 consisting of a surface layer portion of the base region 40 with the semiconductor layer 25. Regarding the first direction X, the plurality of source regions 41 are formed at intervals inward from both peripheral portions of each base region 40 and expose the both peripheral portions of each base region 40 from the first main surface 21.

The planar shapes of the plurality of source regions 41 are arbitrary. The plurality of source regions 41 may each be formed in a square shape in plan view or may each be formed in a circular shape (includes elliptical shape) in plan view. The plurality of source regions 41 are each formed in a band shape extending in the second direction Y, in this embodiment.

The semiconductor device 1 includes a single or a plurality of (in this embodiment, a plurality of) base contact regions 43 of the p-type that are formed in regions different from the source regions 41 in the surface layer portion of each base region 40. The plurality of base contact regions 43 are each formed as a part of the anode region of the first backflow prevention diode 13. Each base contact region 43 has a p-type impurity concentration exceeding the p-type impurity concentration of each base region 40. The p-type impurity concentration of each base contact region 43 may be not less than $1 \times 10^{18}$ cm$^{-3}$ and not more than $1 \times 10^{20}$ cm$^{-3}$.

The plurality of base contact regions 43 are arranged at intervals in the first direction X at the surface layer portion of each base region 40, in this embodiment. Specifically, the plurality of base contact regions 43 are alternately arranged with the plurality of source regions 41 such as to sandwich the single source regions 41. A loop array that includes the plurality of source regions 41 and the plurality of base contact regions 43 is thereby formed in the surface layer portion of each base region 40. In this embodiment, both of a start point and an end point of the loop array are formed by the source regions 41. However, one or both of the start point and the end point of the loop array is or are formed by the base contact regions 43.

The planar shapes of the plurality of base contact regions 43 are arbitrary. The plurality of base contact regions 43 may each be formed in a quadrilateral shape (square shape), or may each be formed in a circular shape (including an oval shape). The plurality of base contact regions 43 are each formed in a band shape extending in the second direction Y, in this embodiment.

The semiconductor device 1 includes a single or a plurality of (in this embodiment, a plurality of) well regions 50 of the n-type that are formed in the surface layer portion of the first main surface 21 at intervals from the base regions 40 at the diode region 28. A number of the well region 50 is adjusted in accordance with the number of the base region 40. The plurality of well regions 50 are each formed as a part of the cathode region of the first backflow prevention diode 13. Each well region 50 demarcates a drift region 51 with each base region 40. The drift region 51 is adjacent to the channel regions 42. Each well region 50 has an n-type impurity concentration exceeding the n-type impurity concentration of the semiconductor layer 25. The n-type impurity concentration of each well region 50 may be not less than $1 \times 10^{15}$ cm$^{-3}$ and not more than $1 \times 10^{17}$ cm$^{-3}$.

The plurality of well regions 50 are formed at intervals from the embedded region 35 to the first main surface 21 side and face the embedded region 35 across the semiconductor layer 25. The plurality of well regions 50 are each formed in an annular shape (a quadrilateral annular shape, in this embodiment) surrounding the corresponding single base region 40, in plan view. Each drift region 51 is thereby defined in an annular shape, in plan view. The planar shape of the well region 50 is arbitrary and the well region 50 may be formed in an oval annular shape.

With reference to FIG. 6, the plurality of well regions 50 each has a well width W. The well width W is a width in a direction orthogonal to a direction that the well region 50 extends. The well width W may be not less than 0.5 μm and not more than 5 μm. The well width W is preferably not less than 1 μm and not more than 4 μm.

The plurality of well regions 50 each includes a first region 52 and a second region 53 that extend in different directions from each other. The first region 52 extends along a long side of the base region 40 (that is, the first direction X). The second region 53 extends along a short side of the base region (that is, the second direction Y). The well width W of the second region 53 may differ from the well width W of the first region 52. The well width W of the second region 53 is less than the well width W of the first region 52 in this embodiment. As a matter of course, the well width W of the second region 53 may be equal to the well width W of the first region 52 or may exceed the well width W of the first region 52.

The first regions 52 of the plurality of well regions 50 are integrally formed at regions between the plurality of base regions 40 adjacent each other, in this embodiment. The plurality of well regions 50 thereby form a single ladder well region enclosing the plurality of base regions 40 in a ladder shape in plan view. The plurality of first regions 52 are alternately formed with the plurality of base regions 40 in the second direction Y such as to sandwich the single drift region 51.

The semiconductor device 1 includes a single or a plurality of (in this embodiment, a plurality of) drain regions 54 of the n-type that are formed in the surface layer portions of the plurality of well regions 50. The plurality of drain regions 54 are each formed as a part of the cathode region of the first backflow prevention diode 13. Each drain region 54 has an n-type impurity concentration exceeding the n-type impurity concentration of each well region 50. The n-type impurity concentration of each drain region 54 may be not less than $1 \times 10^{18}$ cm$^{-3}$ and not more than $1 \times 10^{20}$ cm$^{-3}$.

The plurality of drain regions 54 are formed in a surface layer portion of the first region 52 of each well region 50 at intervals from the second region 53 of each well region 50. Specifically, the plurality of drain regions 54 are formed in the surface layer portion of the first region 52 of each well region 50 and are not formed in the second regions 53. The plurality of drain regions 54 are only formed in regions facing the base regions 40 in the second direction Y at the surface layer portions of the first regions 52, in this embodiment. The first region 52 of the well region 50 is formed as a valid region in which a main current path is formed by the plurality of drain regions 54.

The plurality of drain regions 54 are formed at intervals in the first direction X at the surface layer portion of the first region 52 of each well region 50. The plurality of drain regions 54 face the plurality of source regions 41 in one-to-one correspondence in the second direction Y. According to this structure, the plurality of drain regions 54 form current paths that lead to the plurality of source regions 41 at the shortest distance, in the drift region 51. Therefore, the resistance component in the current paths can be reduced. The plurality of drain regions 54 do not necessarily have to face the plurality of source regions 41 in one-to-one correspondence. The plurality of drain regions 54 may face the plurality of base contact regions 43 in the second direction Y in one-to-one correspondence.

The plurality of drain regions 54 are formed at intervals inward from a peripheral portion of the first region 52 of each well region 50, regarding the second direction Y. The planar shapes of the plurality of drain regions 54 are arbitrary. The plurality of drain regions 54 are each formed in a square shape or each formed in a circular shape (including an oval shape). The plurality of drain regions 54 are each formed in a band shape extending in the second direction Y, in this embodiment.

With reference to FIG. 6, the plurality of drain regions 54 each has a first drain width WD1 in the first direction X and each has a second drain width WD2 in the second direction Y. The first drain width WD1 may be not less than 0.1 μm and not more than 3 μm. The first drain width WD1 is preferably not less than 0.5 μm and not more than 2.5 μm. The first drain width WD may be equal to the width of the first direction X of the source region 41. The second drain width WD2 is preferably less than the well width W of the well region 50. The second drain width WD2 may be not less than 0.1 μm and not more than 4 μm. The second drain width WD2 is preferably not less than 0.5 μm and not more than 3.5 μm.

The semiconductor device 1 includes a plurality of outer drain regions 55 of the n-type that are formed in regions outside the plurality of drain regions 54 at the surface layer portions of the plurality of well regions 50. Each outer drain region 55 has an n-type impurity concentration exceeding the n-type impurity concentration of each well region 50. Each outer drain region 55 has the n-type impurity concentration equal to the n-type impurity concentration of the drain regions 54.

The plurality of outer drain regions 55 are formed in the surface layer portions of the second regions 53 of the plurality of well regions 50, respectively. Furthermore, the plurality of outer drain regions 55 are drawn out into the first region 52 from the second region 53 at each well region 50, and are integrally formed with two drain regions 54 located at both ends among the plurality of drain regions 54. The plurality of outer drain regions 55 are formed at intervals inward from the peripheral portion of each well region 50. The plurality of outer drain regions 55 suppress an undesired channel inversion in the well region 50.

The semiconductor device 1 includes a single or a plurality of (in this embodiment, a plurality of) impurity regions 56 of the p-type that are formed in the surface layer portions of the plurality of well regions 50. Each impurity region 56 has a p-type impurity concentration exceeding the p-type impurity concentration of each base region 40. The p-type impurity concentration of each impurity region 56 may be not less than $1 \times 10^{18}$ cm$^{-3}$ and not more than $1 \times 10^{20}$ cm$^{-3}$.

The plurality of impurity regions 56 are formed in the surface layer portion of the first region 52 of each well region 50 at intervals from the second region 53 of each well region 50. Specifically, the plurality of impurity regions 56 are formed only in the surface layer portion of the first region 52 of each well region 50 and are not formed in the second region 53. The plurality of impurity regions 56 are formed only in regions that oppose the base regions 40 in the second direction Y at the surface layer portion of the first region 52 of each well region 50, in this embodiment.

The plurality of impurity regions 56 are formed at intervals in the first direction X in the surface layer portion of the first region 52 of each well region 50. Specifically, the plurality of impurity regions 56 are formed alternately with the plurality of drain regions 54 such as to sandwich one of the drain regions 54 in the surface layer portion of the first region 52 of each well region 50. That is, the plurality of impurity regions 56 are electrically connected to the plurality of drain regions 54 in the first direction X, and are not electrically connected to the plurality of drain regions 54 in the second direction Y.

The plurality of impurity regions 56 are formed at intervals inward from the peripheral portion of the first region 52 of each well region 50. That is, the plurality of impurities regions 56 are electrically connected to the well region 50 in the second direction Y. The peripheral portions of the base regions 40 side of the plurality of impurity regions 56 are preferably arranged inward of the well region 50 with respect to the peripheral portion of the base regions 40 side of the plurality of drain regions 54. Regarding the second direction Y, both peripheral portions of the plurality of impurity regions 56 are formed inside of the well region 50 with respect to both peripheral portions of the drain regions 54, in this embodiment.

The plurality of impurity regions 56 oppose the plurality of base contact regions 43 in the second direction Y in one-to-one correspondence. The plurality of impurity regions 56 do not necessarily have to face the plurality of base contact regions 43 in one-to-one correspondence. The plurality of impurity regions 56 may oppose the plurality of source regions 41 in the second direction Y in one-to-one correspondence in accordance with an arrangement of the plurality of drain regions 54.

The planar shapes of the plurality of impurity regions 56 are arbitrary. The plurality of impurity regions 56 may each be formed in a square shape, a circular shape (including oval shape), etc. in plan view. The plurality of impurity regions 56 are each formed in a band shape extending in the second direction Y, in this embodiment.

With reference to FIG. 6, the plurality of impurity regions 56 each has a first width W1 in the first direction X and each has a second width W2 in the second direction Y. The first width W1 may be not less than 0.1 μm and not more than 3 μm. The first width W1 is preferably not less than 0.5 μm and not more than 2.5 μm. The first width W1 may be equal to the first drain width WD1 of the drain region 54. The first width W1 may be equal to a width of the first direction X of the base contact region 43. The second width W2 is less than the second drain width WD2 of the drain region 54. The second width W2 may be not less than 0.1 μm and not more than 3.5 μm. The second width W2 is preferably not less than 0.5 μm and not more than 3 μm.

The semiconductor device 1 includes a guard region 60 of the p-type that is formed in the surface layer portion of the first main surface 21 at an interval to an opposite side of the plurality of base regions 40 from the plurality of well regions 50 at the diode region 28. Specifically, the guard region 60 is formed in a region between the region separation structure 30 and the plurality of well regions 50 at the surface layer portion of the first main surface 21.

The guard region 60 is formed at an interval from the embedded region 35 to the first main surface 21 side, and faces the embedded region 35 with a part of the semiconductor layer 25 interposed therebetween. The guard region 60 is formed in an annular shape (quadrilateral annular shape, in this embodiment) collectively surrounding the plurality of well regions 50 in plan view. The guard region 60 blocks a leakage current path to be formed in a region between the region separation structure 30 and the plurality of base regions 40.

The guard region 60 includes a guard well region 61 and a guard contact region 62. The guard well region 61 is formed in the surface layer portion of the first main surface 21. Specifically, the guard well region 61 is formed in a depth position between the first main surface 21 and the column embedded region 32 at the semiconductor layer 25. A p-type impurity concentration of the guard well region 61 may be not less than $1 \times 10^{15}$ cm$^{-3}$ and not more than $1 \times 10^{17}$ cm$^{-3}$.

The guard well region 61 may be formed with a depth equal to the depth of the column well region 33. The guard well region 61 may have the p-type impurity concentration equal to the p-type impurity concentration of the column well region 33. According to this structure, it is possible to form the guard well region 61 and the column well region 33 at a same step.

The guard contact region 62 is formed in a surface layer portion of the guard well region 61 at an interval from a bottom portion of the guard well region 61 to the first main surface 21 side. The guard contact region 62 has a p-type impurity concentration exceeding the p-type impurity concentration of the guard well region 61. The p-type impurity concentration of the guard contact region 62 may be not less than $1 \times 10^{18}$ cm$^{-3}$ and not more than $1 \times 10^{20}$ cm$^{-3}$.

The guard contact region 62 may be formed with a depth equal to the depth of the column contact region 34. The guard contact region 62 may have the p-type impurity concentration equal to the p-type impurity concentration of the column contact region 34. According to this structure, it is possible to form the guard contact region 62 and the column contact region 34 at a same step.

The semiconductor device 1 includes a channel stop region 65 of the n-type that is formed in the semiconductor layer 25 at an interval to an opposite side of the plurality of well regions from the guard region 60. Hereinafter, "channel stop" is abbreviated as "CS (channel stop)". The CS region 65 is formed in a region between the region separation structure 30 and the guard region 60 at the surface layer portion of the first main surface 21. The CS region 65 is formed along the periphery of the diode region 28. Specifically, the CS region 65 is formed in an annular shape (quadrilateral annular shape, in this embodiment) surrounding the guard region 60 in plan view.

The CS region 65 is formed in a wall shape in the semiconductor layer 25 such as to be electrically connected to the embedded region 35. The CS region 65 includes a CS embedded region 66, a CS well region 67 and a CS surficial region 68.

The CS embedded region 66 is formed across a boundary between the embedded region 35 and the semiconductor layer 25 and is electrically connected to the embedded region 35. The single CS embedded region 66 is formed in this embodiment, but a number of the CS embedded region 66 is arbitrary as long as the CS embedded region 66 is electrically connected to the embedded region 35. A plurality of CS embedded region 66 may be laminated from the embedded region 35 to the first main surface 21 side. An n-type impurity concentration of the CS embedded region 66 may be not less than $1\times10^{16}$ cm$^{-3}$ and not more than $1\times10^{20}$ cm$^{-3}$.

The CS well region 67 is formed in the surface layer portion of the first main surface 21. Specifically, the CS well region 67 is formed in a region between the first main surface 21 and the CS embedded region 66 at the semiconductor layer 25 and is electrically connected to the CS embedded region 66. The CS embedded region 66 may have an n-type impurity concentration less than the n-type impurity concentration of the CS embedded region 66. The n-type impurity concentration of the CS well region 67 may be not less than $1\times10^{16}$ cm$^{-3}$ and not more than $1\times10^{20}$ cm$^{-3}$.

The CS surficial region 68 is formed in a surface layer portion of the CS well region 67 at interval from a bottom of the CS well region 67 to the first main surface 21 side. The CS surficial region 68 has an n-type impurity concentration exceeding the n-type impurity concentration of the CS well region 67. The n-type impurity concentration of the CS surficial region 68 may be not less than $1\times10^{18}$ cm$^{-3}$ and not more than $1\times10^{20}$ cm$^{-3}$. The CS surficial region 68 may have the n-type impurity concentration equal to the n-type impurity concentration of the source region 41 (the drain region 54).

The semiconductor device 1 includes an insulating film 70 that selectively covers the first main surface 21. The insulating film 70 consists of a field oxide film, in this embodiment. The field oxide film may be referred to as a LOCOS (local oxidation of silicon) film. The insulating film 70 is formed on the first main surface 21 such as to expose the region separation structure 30, the plurality of base regions 40, the plurality of well regions 50, the guard region 60 and the CS region 65, and to cover the drift region 51. Specifically, the insulating film 70 includes a plurality of first insulating films 70A, a single second insulating film 70B, a single third insulating film 70C, a single fourth insulating film 70D and a single fifth insulating film 70E.

The plurality of first insulating films 70A are each formed in a region between the corresponding base region 40 and the corresponding well region 50 such as to cover the corresponding drift region 51. Each first insulating film 70A is formed in an annular shape surrounding the corresponding base region 40 in plan view. An inner end portion of each first insulating film 70A covers a peripheral portion of the corresponding base region 40, and exposes the channel regions 42, the source regions 41 and the base contact regions 43.

An outer end portion of each first insulating film 70A covers an inner peripheral portion of the well region 50, and exposes an inner portion of the well region 50, the drain regions 54, the outer drain regions 55 and the impurity regions 56. Specifically, the outer end portion of each first insulating film 70A covers peripheral portions of the plurality of drain regions (the outer drain regions 55), and exposes peripheral portions of the plurality of impurity regions 56. The outer end portion of each first insulating film 70A thereby exposes the well region 50 from a region between the peripheral portions of the plurality of impurity regions 56 and the outer end portion of each first insulating film 70A.

The second insulating film 70B is formed in a region between the well region 50 and the guard region 60. The second insulating film 70B is formed in an annular shape surrounding the well region 50 in plan view. An inner end portion of the second insulating film 70B covers an outer peripheral portion of the well region 50 and exposes the outer drain regions 55. Specifically, the inner end portion of the second insulating film 70B covers peripheral portions of the plurality of outer drain regions 55 and exposes inner portions of the plurality of outer drain regions 55.

Furthermore, the inner end portion of the second insulating film 70B covers an outer peripheral portion of the outermost well region 50, and exposes the inner portion of the well region 50, the drain regions 54, the outer drain regions 55 and the impurity regions 56. Specifically, the inner end portion of the second insulating film 70B covers peripheral portions of the plurality of drain regions 54 (the outer drain regions 55), and exposes peripheral portions of the plurality of impurity regions 56. The inner end portion of the second insulating film 70B thereby exposes the well region 50 from a region between the peripheral portions of the plurality of impurity regions 56 and the inner end portion of the second insulating film 70B. An outer end portion of the second insulating film 70B covers a peripheral portion of the guard region 60, and exposes an inner portion of the guard region 60.

The third insulating film 70C is formed in a region between the guard region 60 and the CS region 65. The third insulating film 70C is formed in an annular shape surrounding the guard region 60 in plan view. An inner end portion of the third insulating film 70C covers an outer peripheral portion of the guard region 60, and exposes the inner portion of the guard region 60. An outer end portion of the third insulating film 70C covers an inner peripheral portion of the CS region 65, and exposes an inner portion of the CS region 65.

The fourth insulating film 70D is formed in a region between the CS region 65 and the region separation structure 30 (the column region 31). The fourth insulating film 70D is formed in an annular shape surrounding the CS region 65 in plan view. An inner end portion of the fourth insulating film 70D covers an outer peripheral portion of the CS region 65, and exposes the inner portion of the CS region 65. An outer end portion of the fourth insulating film 70D covers an inner peripheral portion of the region separation structure 30 (the column region 31), and exposes an inner portion of the region separation structure 30 (the column region 31).

The fifth insulating film 70E is formed in a region outside the region separation structure 30 (the column region 31). The fifth insulating film 70E covers an outer peripheral portion of the region separation structure 30 (the column region 31), and exposes the inner portion of the region separation structure 30 (the column region 31).

The semiconductor device 1 includes a plurality of gate structures 71 that are formed on the first main surface 21 at the diode region 28. The plurality of gate structures 71 are formed on the plurality of channel regions 42 that are exposed from the insulating film 70, respectively. That is, the plurality of gate structures 71 are formed in regions surrounded by the inner end portions of the plurality of first insulating films 70A, respectively. The plurality of gate structures 71 each has a laminated structure that includes a gate insulating film 72 and a gate electrode 73 formed in that order from the first main surface 21 side.

The gate insulating film 72 has a thickness less than a thickness of the insulating film 70. The gate insulating film 72 may include a silicon oxide. The gate insulating film 72 covers the channel regions 42, the peripheral portions of the source regions 41 and the peripheral portion of the base contact region 43. Specifically, the gate insulating film 72 is formed in an annular shape in plan view that includes an inner end portion and an outer end portion.

The inner end portion of the gate insulating film 72 demarcates a contact opening 74. The contact opening 74 exposes the inner portion of the base region 40, the inner portions of the plurality of source regions 41 and the inner portions of the plurality of base contact regions 43. The contact opening 74 is formed in a band shape extending in the first direction X, in this embodiment. The outer end portion of the gate insulating film 72 is connected to the insulating film 70 (the inner end portion of the first insulating film 70A).

The gate electrode 73 includes a conductive polysilicon, in this embodiment. The gate electrode 73 is formed on the gate insulating film 72 and opposes the channel regions 42 across the gate insulating film 72 interposed therebetween. The gate electrode 73 has a drawer portion 75 that is drawn out onto the insulating film 70 (the first insulating film 70A) from on the gate insulating film 72. The drawer portion 75 of the gate electrode 73 opposes the drift region 51 across the insulating film 70 (the first insulating film 70A) interposed therebetween.

Specifically, the gate electrode 73 includes an inner end portion and an outer end portion in plan view, and is formed in an annular shape surrounding the base regions 40. The inner end portion of the gate electrode 73 demarcates the contact opening 74 with the inner end portion of the gate insulating film 72.

The outer end portion of the gate electrode 73 is formed by the drawer portion 75, and is formed on the insulating film 70 at an interval inward from the inner end portion of the well region 50 in plan view. The outer end portion of the gate electrode 73 is arranged at a region between the base regions 40 and the well region 50 in plan view, in this embodiment. The outer end portion of the gate electrode 73 is formed in a quadrilateral shape (specifically, rectangular shape extending in the first direction X) in plan view. A planar shape of the outer end portion of the gate electrode 73 is arbitrary and the outer end portion of the gate electrode 73 may be formed in an elliptic shape.

The plurality of source regions 41 and the plurality of base contact regions 43 may be formed in a self-aligned manner with respect to the gate electrode 73, respectively. That is, the plurality of source regions 41 and the plurality of base contact regions 43 are formed by introducing the n-type impurities and the p-type impurities via ion implantation masks that exposes at least the inner end portion of the gate electrode 73. In this case, a loop array including the n-type region and the p-type region corresponding to the loop array including the plurality of source regions 41 and the plurality of base contact regions 43 is formed in at least the inner end portion of the gate electrode 73.

The semiconductor device 1 includes an interlayer insulating film 80 that is formed on the first main surface 21. The interlayer insulating film 80 is formed on the insulating film 70 and collectively covers the diode region 28. The interlayer insulating film 80 covers portions exposed from the insulating film 70 in the region separation structure 30 (the column region 31), the plurality of base regions 40, the plurality of source regions 41, the plurality of base contact regions 43, the plurality of well regions 50, the plurality of drain regions 54, the plurality of outer drain regions 55, the plurality of impurity regions 56, the guard region 60 and the CS region 65.

The semiconductor device 1 includes a single or a plurality of (single, in this embodiment) region separation connection electrode 81, a plurality of source connection electrodes 82, a plurality of drain connection electrodes 83, a single or a plurality of (single, in this embodiment) guard connection electrode 84, and a plurality of gate connection electrodes 86.

The region separation connection electrode 81 penetrates the interlayer insulating film 80 and is electrically connected to the region separation structure 30 (the column contact region 34). The region separation connection electrode 81 is fixed to a substrate potential (for example, a ground potential). The region separation connection electrode 81 may be formed in a band shape (for example, an annular shape) extending along the region separation structure 30 in plan view. A plurality of the region separation connection electrodes 81 may be formed at intervals along the region separation structure 30 in plan view.

The plurality of source connection electrodes 82 penetrate the interlayer insulating film 80 and are electrically connected to the corresponding base region 40, the corresponding source regions 41 and the corresponding base contact regions 43, respectively. The plurality of source connection electrodes 82 are fixed to a gate potential. That is, the plurality of source connection electrodes 82 are fixed to the same potential as that of the gate electrode 73.

The plurality of source connection electrodes 82 are each formed in a band shape crossing the plurality of source regions 41 and the plurality of base contact regions 43 in the first direction X inside the corresponding contact opening 74. Both ends of the plurality of source connection electrodes 82 are electrically connected to both peripheral portions of the corresponding base region 40, respectively. The base regions 40, the source regions 41 and the base contact regions 43 are therefore fixed to the same potential (the gate potential).

The plurality of drain connection electrodes 83 penetrate the interlayer insulating film 80 and are electrically connected to the corresponding drain regions 54 and the corresponding impurity regions 56, respectively. The plurality of drain connection electrodes 83 are fixed to a drain potential. The plurality of drain connection electrodes 83 are each formed in a band shape crossing the plurality of drain regions 54 and the plurality of impurity regions 56 in the first direction X.

Both ends of the plurality of drain connection electrodes 83 are connected to the drain regions 54 located at both ends, respectively. That is, the plurality of drain connection electrodes 83 are electrically connected to the plurality of outer drain regions 55 via the drain regions 54 located at both ends. The well region 50, the drain regions 54, the outer drain regions 55 and the impurity regions 56 are therefore fixed to the same potential (the drain potential).

The guard connection electrode 84 penetrates the interlayer insulating film 80 and is electrically connected to the guard region 60. The guard connection electrode 84 is fixed to the same potential (the drain potential) as that of the plurality of drain connection electrodes 83. That is, the guard region 60 is fixed to the same potential as those of the drain regions 54, etc. The guard connection electrode 84 may be formed in a band shape (specifically, an annular shape) extending along the guard region 60 in plan view. A plurality of guard connection electrode 84 may be formed at intervals along the guard region 60 in plan view.

The plurality of gate connection electrodes 86 penetrate the interlayer insulating film 80 and are electrically connected to the corresponding gate electrode 73, respectively. Specifically, the plurality of gate connection electrodes 86 are each electrically connected to any portion of the drawer portion 75 of the corresponding gate electrode 7. In this embodiment, regarding the first direction X, the plurality of gate connection electrodes 86 are electrically connected to both end portions of the plurality of gate electrode 73, respectively. In FIG. 7 and FIG. 8, the gate connection electrode 86 is shown for convenience to show the connecting configuration. The plurality of gate connection electrodes 86 are fixed to the gate potential. That is, the gate electrode 73 is fixed to the same potential as those of the base regions 40, the source regions 41, the base contact regions 43, etc.

With reference to FIG. 7, the first backflow prevention diode 13 includes a diode structure 90 of an EIS (Electrode-Insulator-Semiconductor)-type. Specifically, the diode structure 90 includes the base region 40 of the p-type, the source region 41 of the n-type, the base contact region 43 of the p-type, the well region 50 of the n-type, the drain region 54 of the n-type and the gate structure 71.

With reference to FIG. 8, the first backflow prevention diode 13 includes a thyristor structure 91 that is electrically connected to the diode structure 90. Specifically, the thyristor structure 91 includes the impurity regions 56 of the p-type, the semiconductor layer 25 of the n-type, the base region 40 of the p-type and the source region 41 of the n-type that are formed in that order along the first main surface 21 of the semiconductor layer 25.

More specifically, the thyristor structure 91 includes a first transistor structure 92 of the pnp-type (first polar type) at the well region 50 side and a second transistor structure 93 of the npn-type (second polar type) at the base region 40 side. The first transistor structure 92 includes the impurity region 56 of the p-type, the semiconductor layer 25 of the n-type and the base region 40 of the p-type that are formed in that order along the first main surface 21 of the semiconductor layer 25. The second transistor structure 93 includes the source region 41 of the n-type, the base region 40 of the p-type and the semiconductor layer 25 of the n-type that order along the first main surface 21 of the semiconductor layer 25.

When a forward voltage VF of the diode structure 90 is applied to the source connection electrode 82 (the gate electrode 73) and the drain connection electrode 83, the diode structure 90 becomes ON state whereas the thyristor structure 91 becomes OFF state. Since the drain regions 54 and the impurity regions 56 are fixed to the same potential, the thyristor structure 91 becomes OFF state. The diode structure 90 is therefore conducted and a forward current IF flows into the diode structure 90. This forward current IF flows into the first transistor structure 92 electrically connected to the diode structure 90 as well.

On the other hand, when a reverse voltage VR of the diode structure 90 is applied to the source connection electrode 82 (the gate electrode 73) and the drain connection electrode 83, the diode structure 90 becomes OFF state whereas the thyristor structure 91 becomes ON state. The thyristor structure 91 is therefore conducted and the reverse current IR flows into the thyristor structure 91.

Figure 9:
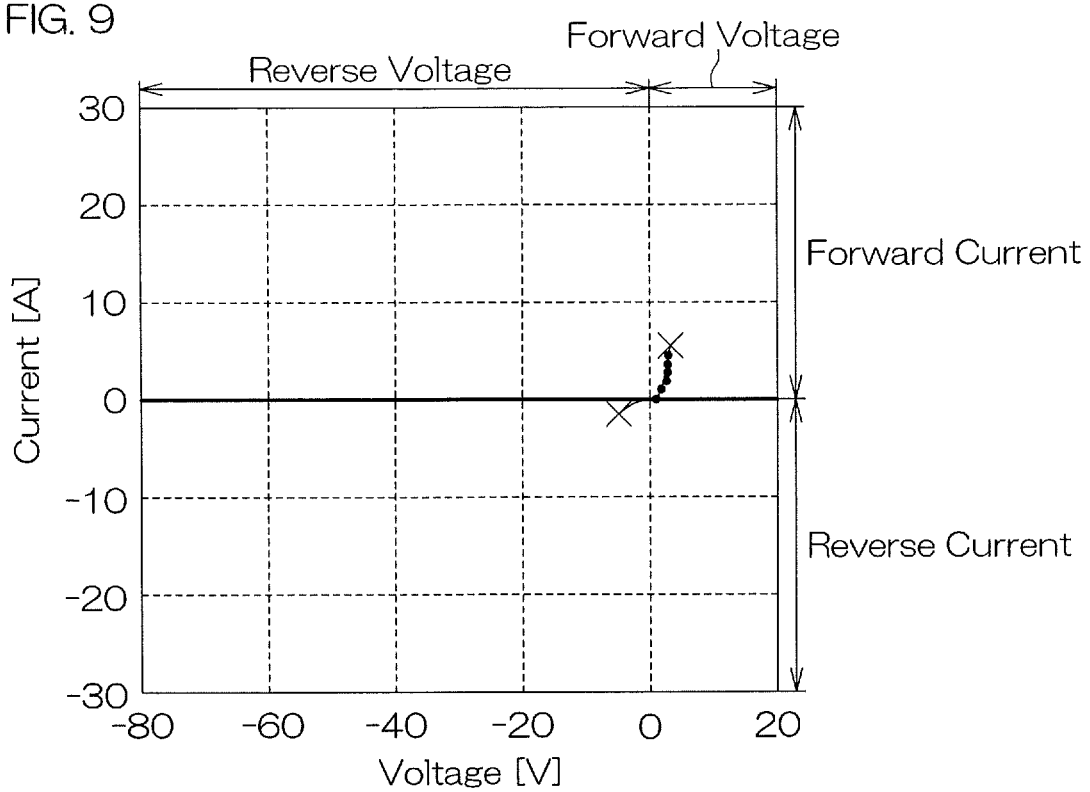
FIG. 9 is a graph showing current-voltage characteristics of a backflow prevention diode according to a comparative example.
Figure 10:
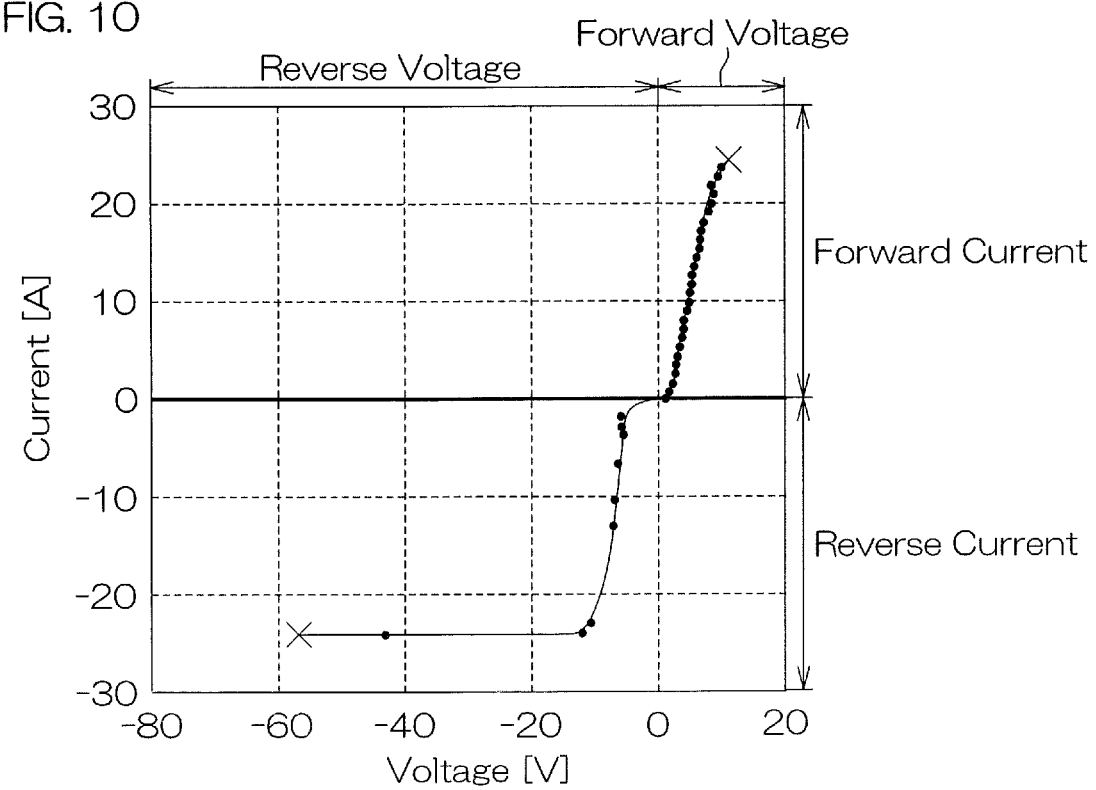
FIG. 10 is a graph showing current-voltage characteristics of a backflow prevention diode according to the present embodiment.

FIG. 9 is a graph showing current-voltage characteristics of a backflow prevention diode according to a comparative example. FIG. 10 is a graph showing current-voltage characteristics of the first backflow prevention diode 13 according to this embodiment. The current-voltage characteristics shown in FIG. 9 and FIG. 10 were investigated by a known TLP (Transmission Line Pulse) measurement method.

In FIG. 9 and FIG. 10, a coordinates shows a current [A], and an abscissa shows a voltage [V]. A positive current means the forward current IF, and a negative current means the reverse current IR. A positive voltage means the forward voltage VF, and a negative voltage means the reverse voltage VR. The backflow prevention diode according to the comparative example does not have the impurity region 56. That is, the backflow prevention diode according to the comparative example has only the diode structure 90 and does not have the thyristor structure 91.

With the backflow prevention diode according to the comparative example, the forward current IF leading to the electrostatic destruction was about +5 A, while the reverse current IR leading to the electrostatic destruction was about −0.5 A. On the other hand, with the first backflow prevention diode 13 according to this embodiment, the forward current IF leading to the electrostatic destruction was about +25 A, while the reverse current IR leading to the electrostatic destruction was about −24 A. With the first backflow prevention diode 13 according to this embodiment, the electrostatic withstand capacities in both forward direction and reverse direction were improved compared with the backflow prevention diode according to the comparative example.

With the first backflow prevention diode 13 according to this embodiment, unlike the backflow prevention diode according to the comparative example, when a forward overvoltage due to the static electricity, etc. is applied, a forward overcurrent can be processed by the diode structure 90 and the first transistor structure 92.

Also, when a reverse overvoltage due to the static electricity, etc. is applied to the first backflow prevention diode 13 according to this embodiment, a reverse overcurrent can be processed by the thyristor structure 91. As a result, in the first backflow prevention diode 13 according to this embodiment, the electrostatic withstand capacity was improved compared with the backflow prevention diode according to the comparative example.

Therefore, according to the semiconductor device 1, the electrostatic withstand capacity can be improved. Especially, in the structure in which the thyristor structure 91 is incorporated, the improvement of the electrostatic withstand capacity on the forward voltage VF (the forward current IF) side due to the function of the first transistor structure 92 is a heterogeneous effect that cannot be achieved by a general thyristor device to be used as a protective device for the reverse voltage VR.

Also, according to the semiconductor device 1, the impurity region 56 is formed in the surface layer portion of the well region 50 at an interval inward from the peripheral portion of the well region 50. According to this structure, regarding the lateral direction parallel to the first main surface 21, a part of the well region 50 is interposed in the region between the impurity region 56 and the semiconductor layer 25, and a base resistance is formed by a part of the well region 50. This allows the thyristor structure 91 to be operated appropriately.

For example, in a case in which the drain region 54 is formed in a region between the impurity region 56 and the semiconductor layer 25 at the surface layer portion of the well region 50, the base of the first transistor structure 92 is short-circuited to the emitter of the first transistor structure 92 by the drain region 54 having a relatively low resistance. Therefore, the operation of the thyristor structure 91 may become unstable.

Thus, in the semiconductor device 1, the peripheral portion of the base region 40 side of the impurity region 56 is formed inward of the well region 50 with respect to the peripheral portion of the base region 40 side of the drain region 54. According to this structure, it is possible to appropriately suppress the base and the emitter of the first transistor structure 92 from being short-circuited by the drain region 54. Therefore, the thyristor structure 91 can be operated more appropriately. Also, according to this structure, in a case in which the over voltage is applied between the drain region 54 and the source region 41, a punch-through between the drain region 54 and the source region 41 can be suppressed. Therefore, it is possible to suppress a decrease in the punch-through breakdown withstand voltage.

Also, according to the semiconductor device 1, the impurity region 56 opposes the drain region 54 in the direction that is orthogonal to the opposite direction between the base region 40 and the well region 50. According to this structure, the thyristor structure 91 can be formed on a line leading to the base region 40 and the impurity region 56. It is therefore possible to appropriately suppress the operation of the thyristor structure 91 from being interfered with by the drain region 54.

Also, the semiconductor device 1 includes the guard region 60 of the p-type that is formed in the region between the column region 31 and the well region 50 at the surface layer portion of the first main surface 21. The guard region 60 is fixed to the same potential as those of the drain region 54, etc. Specifically, the semiconductor device 1 includes the drain connection electrodes 83 that is connected to the drain region 54, etc. on the first main surface 21, and the guard connection electrode 84 that is electrically connected to the guard region 60 on the first main surface 21 and that is fixed to the same potential as that of the drain connection electrodes 83.

A first parasitic transistor of the pnp-type (first polar type) includes the base region 40 of the p-type, the semiconductor layer 25 of the n-type and the column region 31 of the p-type is formed in a region between the column region 31 and the base region 40 at the diode region 28. When the forward voltage VF of the diode structure 90 is applied to the source connection electrode 82 (the gate electrode 73) and the drain connection electrode 83, a leakage current may flow into the column region 31 via the first parasitic transistor.

Therefore, in the semiconductor device 1, the guard region 60 is formed in the region between the column region 31 and the well region 50. According to this structure, a second parasitic transistor of the pnp-type (first polar type) that includes the base region 40 of the p-type, the semiconductor layer 25 of the n-type and the guard region 60 of the p-type is formed in the region between the column region 31 and the base region 40 at the diode region 28.

This allows the leakage current to flow into the guard connection electrode 84 via the second parasitic transistor when the forward voltage VF of the diode structure 90 is applied. As a result, it is possible to reduce the leakage current while suppressing an interference caused by the thyristor structure 91. Reducing the leakage current is effective in improving the electrical characteristics of the diode region 28, and at the same time, reducing the leakage current is also effective in suppressing fluctuations in the electrical characteristics of other functional device regions 27 caused by the leakage current.

The embodiment of the present invention can be implemented in still other embodiments.

In the embodiment aforementioned, the example in which the insulating film 70 consists of the field oxide film has been described. However, the insulating film 70 may be embedded into a trench. In this case, STI (shallow trench isolation) structure may be configured by the trench and the insulating film 70.

In the embodiment aforementioned, the example in which "the first conductivity type" is "the p-type" and "the second conductivity type" is "the n-type" has been described, but "the first conductivity type" may be "the n-type" and "the second conductivity type" may be "the p-type". The specific configuration in this case is obtained by replacing "the n-type region" with "the p-type region" and by replacing "the p-type region" with "the n-type region" in the above explanation and attached drawings. In the embodiment aforementioned, "the p-type" has been expressed as "the first conductivity type" and "the n-type" has been expressed as "the second conductivity type" to clarify the order of explanation. However, "the p-type" may be expressed as "the second conductivity type" and "the n-type" may be expressed as "the first conductivity type".

In the embodiment aforementioned, the example in which the first backflow prevention diode 13 (the second backflow prevention diode 17) is incorporated into the circuit portion of the CAN has been described. However, the first backflow prevention diode 13 (the second backflow prevention diode 17) can also be incorporated into circuits of various applications other than the CAN. For example, the first backflow prevention diode 13 (the second backflow prevention diode 17) can be incorporated into a circuit section of an in-vehicle switch IC, a circuit section of a DC/DC converter, a circuit section of the in-vehicle network such as an LIN (Local Interconnect Network) and a FlexRay, and the like. The first backflow prevention diode 13 (the second backflow prevention diode 17) may be incorporated into a circuit section of a non-vehicle application.

Hereinafter, examples of features extracted from the present descriptions and the attached drawings shall be indicated below. The EIS-type diode structure has a structural feature that an electrostatic withstand capacity is low. The electrostatic withstand capacity is also referred to as an ESD (Electro Static Discharge) withstand voltage. The following [A1] to [A17] each provides a semiconductor device that has an EIS-type diode structure and is capable of improving an electrostatic charge withstand capacity.

[A1] A semiconductor device comprising: a semiconductor layer of a first conductivity type that has a main surface and that includes a device region; a base region of a second conductivity type that is formed in a surface layer portion of the main surface at the device region; a source region of the first conductivity type that is formed in a surface layer portion of the base region at an interval inward from a peripheral portion of the base region and that defines a channel region with the semiconductor layer; a base contact region of the second conductivity type that is formed in a region different from the source region at the surface layer portion of the base region and that has an impurity concentration exceeding an impurity concentration of the base region; a well region of the first conductivity type that is formed in the surface layer portion of the main surface at an interval from the base region at the device region and that defines a drift region with the base region; a drain region of the first conductivity type that is formed in a surface layer portion of the well region; an impurity region of the second conductivity type that is formed in the surface layer portion of the well region and that is electrically connected to the drain region; and a gate structure that has a gate insulating film covering the channel region on the main surface and a gate electrode facing the channel region on the gate insulating film and electrically connected to the source region and the base contact region.

This semiconductor device includes an EIS-type diode structure at the device region. Specifically, the diode structure includes the base region, the source region, the base contact region, the well region, the drain region and the gate structure. Also, the semiconductor device includes a thyristor structure that is electrically connected to the diode structure at the device region. Specifically, the thyristor structure includes the impurity region (the second conductivity type), the semiconductor layer (the first conductivity type), the base region (the second conductivity type) and the source region (the first conductivity type) that are formed in that order along the main surface of the semiconductor layer.

More specifically, the thyristor structure includes a first transistor structure of a first polar type at the well region side and a second transistor structure of a second polar type at the base region side. The first transistor structure includes the impurity region (the second conductivity type), the semiconductor layer (the first conductivity type) and the base region (the second conductivity type) that are formed in that order along the main surface of the semiconductor layer. The second transistor structure includes the source region (the first conductivity type), the base region (the second conductivity type) and the semiconductor layer (the first conductivity type) that are formed in that order along the main surface of the semiconductor layer.

In a case in which a forward voltage is applied to the diode structure, the diode structure becomes an ON state whereas the thyristor structure becomes an OFF state. The thyristor structure becomes the OFF state since the drain region and the impurity region are to be fixed to a same potential. The diode structure is therefore conducted and a forward current flows into the diode structure. Further, this forward voltage also flows into the first transistor structure that is electrically connected to the diode structure. Therefore, when a forward overvoltage due to a static electricity, etc. is applied to the diode structure, a forward overcurrent can be processed by the diode structure and the first transistor structure.

On the other hand, in a case in which a reverse voltage is applied to the diode structure, the diode structure becomes an OFF state whereas the thyristor structure becomes an ON state. The thyristor structure is therefore conducted and a reverse current flows into the thyristor structure. Therefore, when a reverse overvoltage due to the static electricity, etc. is applied to the diode structure, the reverse overcurrent can be processed by the thyristor structure. As a result, according to this semiconductor device, it is possible to improve an electrostatic charge withstand capacity.

[A2] The semiconductor device according to A1, wherein the impurity regions is formed at an interval inward from a peripheral portion of the well region.

[A3] The semiconductor device according to A1 or A2, wherein the impurity region is connected to the drain region in a direction orthogonal to an opposite direction between the base region and the well region.

[A4] The semiconductor device according to any one of A1 to A3, wherein a plurality of the impurity regions are formed such as to sandwich the single drain region.

[A5] The semiconductor device according to any one of A1 to A4, wherein a plurality of the drain regions are formed at an interval.

[A6] The semiconductor device according to any one of A1 to A5, wherein the base region is formed in a band shape extending along one direction as viewed in plan, and the impurity region is formed in a region of the well region that faces a long side of the base region.

[A7] The semiconductor device according to any one of A1 to A6, wherein the well region is formed in an annular shape surrounding the base region as viewed in plan, and the gate electrode is formed in an annular shape surrounding the base region at a region between the base region and the well region as viewed in plan.

[A8] The semiconductor device according to any one of A1 to A7, further comprising: a region separation structure that is formed in the main surface and that electrically separates the device region from another region.

[A9] The semiconductor device according to A8, wherein the region separation structure consists of a column region of the second conductivity type that is formed in the semiconductor layer.

[A10] The semiconductor device according to A9, further comprising: a guard region of the second conductivity type that is formed in a region between the well region and the column region at the surface layer portion of the main surface and that is electrically connected to the drain region.

[A11] The semiconductor device according to any one of A1 to A10, wherein the base contact region is formed in the surface layer portion of the base region at an interval inward from the peripheral portion of the base region and that is electrically connected to the source region.

[A12] The semiconductor device according to any one of A1 to A11, further comprising: an insulating film that covers the drift region on the main surface; wherein the gate insulating film has a thickness less than a thickness of the insulating film and is continuous to the insulating film.

[A13] The semiconductor device according to A12, wherein the gate electrode includes a drawer portion that is drawn out onto the insulating film from on the gate insulating film and that faces the drift region across the insulating film interposed between the drift region and the gate electrode.

[A14] The semiconductor device according to any one of A1 to A13, further comprising: a semiconductor substrate of the second conductivity type; wherein the semiconductor layer is laminated on the semiconductor substrate.

[A15] The semiconductor device according to A14, further comprising: an embedded region of the first conductivity type that is formed in the device region across a boundary between the semiconductor substrate and the semiconductor layer; wherein the base region and the well region each faces the embedded region across a part of the semiconductor layer.

[A16] The semiconductor device according to A15, further comprising: a channel stop region of the first conductivity type that is formed in the semiconductor layer along a periphery of the device region at the device region.

[A17] The semiconductor device according to A16, wherein the channel stop region extends as a wall shape toward the embedded region and is electrically connected to the embedded region.

This application corresponds to Japanese Patent Application No. 2019-217069 filed in the Japan Patent Office on Nov. 29, 2019, the entire disclosure of which is incorporated herein by reference. While preferred embodiments of the present invention were described in detail above, these are merely specific examples used to clarify the technical contents of the present invention and the present invention should not be interpreted as being limited to these specific examples and the scope of the present invention is limited only by the appended claims.

REFERENCE SIGNS LIST

1: Semiconductor device
3: First main surface
6: Semiconductor substrate
7: Semiconductor layer
28: Diode region (Device region)
31: Column region
35: Embedded region
40: Base region
41: Source region
42: Channel region
43: Base contact region
50: Well region
51: Drift region
54: Drain region
56: Impurity region
60: Guard region
65: Channel stop region
70: Insulating film
71: Gate structure
72: Gate insulating film
73: Gate electrode
73: Drawer portion

The invention claimed is:

1. A semiconductor device comprising:
a semiconductor layer of a first conductivity type that has a main surface and that includes a device region;
a base region of a second conductivity type that is formed in a surface layer portion of the main surface at the device region;
a source region of the first conductivity type that is formed in a surface layer portion of the base region at an interval inward from a peripheral portion of the base region and that defines a channel region with the semiconductor layer;
a base contact region of the second conductivity type that is formed in a region different from the source region at the surface layer portion of the base region and that has an impurity concentration exceeding an impurity concentration of the base region;
a well region of the first conductivity type that is formed in the surface layer portion of the main surface at an interval from the base region at the device region and that defines a drift region with the base region;
a drain region of the first conductivity type that is formed in a surface layer portion of the well region;
an impurity region of the second conductivity type that is formed in the surface layer portion of the well region and that is electrically connected to the drain region; and
a gate structure that has a gate insulating film covering the channel region on the main surface and a gate electrode facing the channel region on the gate insulating film, the gate electrode electrically connected to the source region and the base contact region.

2. The semiconductor device according to claim 1, wherein the impurity region is formed at an interval inward from a peripheral portion of the well region.

3. The semiconductor device according to claim 1, wherein the base region and the well region are opposite each other and separated in a first direction, and the impurity region extends in a second direction orthogonal to the first direction and is connected to the drain region.

4. The semiconductor device according to claim 1, wherein a plurality of impurity regions are formed so as to sandwich the drain region.

5. The semiconductor device according to claim 1, wherein a plurality of drain regions are formed at an interval.

6. The semiconductor device according to claim 1, wherein the base region is formed in a band shape extending along one direction as viewed in plan, and the impurity region is formed in a region of the well region that faces a long side of the base region.

7. The semiconductor device according to claim 1, wherein the well region is formed in an annular shape surrounding the base region as viewed in plan, and the gate electrode is formed in an annular shape surrounding the base region at a region between the base region and the well region as viewed in plan.

8. The semiconductor device according to claim 1, further comprising:
a region separation structure that is formed in the main surface and that electrically separates the device region from another region.

9. The semiconductor device according to claim 8, wherein the region separation structure consists of a column region of the second conductivity type that is formed in the semiconductor layer.

10. The semiconductor device according to claim 9, further comprising:
a guard region of the second conductivity type that is formed in a region between the well region and the column region at the surface layer portion of the main surface and that is electrically connected to the drain region.

11. The semiconductor device according to claim 1, wherein the base contact region is formed in the surface layer portion of the base region at an interval inward from the peripheral portion of the base region and that is electrically connected to the source region.

12. The semiconductor device according to claim 1, further comprising:
an insulating film that covers the drift region on the main surface;
wherein the gate insulating film has a thickness less than a thickness of the insulating film and is continuous with the insulating film.

13. The semiconductor device according to claim 12,
wherein the gate electrode includes a drawer portion that is drawn out onto the insulating film from and on the gate insulating film and that faces the drift region across the insulating film interposed between the drift region and the gate electrode.

14. The semiconductor device according to claim 1, further comprising:
a semiconductor substrate of the second conductivity type;
wherein the semiconductor layer is laminated on the semiconductor substrate.

15. The semiconductor device according to claim 14, further comprising:
an embedded region of the first conductivity type that is formed in the device region across a boundary between the semiconductor substrate and the semiconductor layer;
wherein the base region and the well region each faces the embedded region across a part of the semiconductor layer.

16. The semiconductor device according to claim 15, further comprising:
a channel stop region of the first conductivity type that is formed in the semiconductor layer along a periphery of the device region at the device region.

17. The semiconductor device according to claim 16,
wherein the channel stop region extends as a wall shape toward the embedded region and is electrically connected to the embedded region.

18. The semiconductor device according to claim 1, further comprising:
an interlayer insulating film formed on the main surface; and
a connection electrode that penetrates the interlayer insulating film and is electrically connected to the base region, the source region and the base contact region,
wherein the connection electrode is fixed to a same potential as a potential of the gate electrode.

* * * * *